US012787297B2

(12) United States Patent
Kamisaka et al.

(10) Patent No.: US 12,787,297 B2
(45) Date of Patent: Nov. 3, 2026

(54) FABRICATION METHOD FOR A THREE-DIMENSIONAL MEMORY ARRAY OF THIN-FILM FERROELECTRIC TRANSISTORS USING HIGH-ASPECT-RATIO LOCAL WORD LINE DAMASCENE PROCESS

(71) Applicant: SUNRISE MEMORY CORPORATION, San Jose, CA (US)

(72) Inventors: Shohei Kamisaka, Kanagawa (JP); Yosuke Nosho, Tokyo (JP); Usha Raghuram, Saratoga, CA (US); Kavita Shah, Mountain View, CA (US); Jie Zhou, San Jose, CA (US); Iting Lin, Hsinchu (TW); Eli Harari, Saratoga, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 380 days.

(21) Appl. No.: 18/419,385

(22) Filed: Jan. 22, 2024

(65) Prior Publication Data

US 2024/0260275 A1 Aug. 1, 2024

Related U.S. Application Data

(60) Provisional application No. 63/441,682, filed on Jan. 27, 2023.

(51) Int. Cl.
*H10B 51/20* (2023.01)
*H10B 51/30* (2023.01)

(52) U.S. Cl.
CPC ............ *H10B 51/20* (2023.02); *H10B 51/30* (2023.02)

(58) Field of Classification Search
CPC ................................ H10B 51/20; H10B 51/30
See application file for complete search history.

(56) References Cited

U.S. PATENT DOCUMENTS 10,608,012 B2 3/2020 Huang et al.
11,839,086 B2 12/2023 Petti et al.
(Continued)

OTHER PUBLICATIONS

C. Jones, R. Huang, J. Lowes, S. Simmons and X. -F. Zhong, "High-Temperature-Stable, Spin-On Carbon Materials for High-Aspect-Ratio Gap-Fill Applications," 2021 32nd Annual SEMI Advanced Semiconductor Manufacturing Conference (ASMC), Milpitas, CA, USA, 2021, pp. 1-4, doi: 10.1109/ASMC51741.2021.9435713.
(Continued)

*Primary Examiner* — Jay C Kim
*Assistant Examiner* — Woo K Lee

(57) ABSTRACT

A fabrication process for a memory structure including three-dimensional arrays of thin-film ferroelectric storage transistors is disclosed. In some embodiments, the ferroelectric storage transistors are organized in three-dimensional arrays of horizontal NOR memory strings. In some embodiments, the fabrication process uses a high aspect-ratio damascene process to form local word line structures that extends through the multiple layers of the three-dimensional memory structure. In particular, the high aspect-ratio local word line damascene process forms the gate stack layers, including the channel layer, the gate dielectric layer and the gate conductor layer, in the same sequence of additive deposition processes without any of the gate stack layers being subjected to any intervening etching process. In this manner, the integrity of the gate stack layers and their interfaces are well preserved and the transistor characteristics of the ferroelectric storage transistors are enhanced.

25 Claims, 30 Drawing Sheets

(56) References Cited

U.S. PATENT DOCUMENTS

| | | | |
|---|---|---|---|
| 12,160,996 | B2 | 12/2024 | Petti et al. |
| 2021/0407845 | A1 | 12/2021 | Wang et al. |

OTHER PUBLICATIONS

C. Ju et al., "Improved ferroelectric properties of CMOS back-end-of-line compatible Hf0.5Zr0.5O2 thin films by introducing dielectric layers," Journal of Materiomics, Jun. 24, 2023.

E. Yu, X. Lyu, M. Si, P. D. Ye and K. Roy, "Interfacial Layer Engineering in Sub-5-nm HZO: Enabling Low-Temperature Process, Low-Voltage Operation, and High Robustness," in IEEE Transactions on Electron Devices, vol. 70, No. 6, pp. 2962-2969, Jun. 2023, doi: 10.1109/TED.2023.3270397.

FABRICATION METHOD FOR A THREE-DIMENSIONAL MEMORY ARRAY OF THIN-FILM FERROELECTRIC TRANSISTORS USING HIGH-ASPECT-RATIO LOCAL WORD LINE DAMASCENE PROCESS

CROSS REFERENCE TO RELATED APPLICATIONS

This application relates and claims priority to U.S. Provisional Patent Application No. 63/441,682, entitled FABRICATION METHOD FOR A THREE-DIMENSIONAL MEMORY ARRAY OF THIN-FILM FERROELECTRIC TRANSISTORS USING HIGH-ASPECT-RATIO LOCAL WORD LINE DAMASCENE PROCESS, filed Jan. 27, 2023, which is incorporated herein by reference for all purposes.

The present application relates to U.S. patent application Ser. No. 17/936,315, entitled MEMORY STRUCTURE OF THREE-DIMENSIONAL NOR MEMORY STRINGS OF JUNCTIONLESS FERROELECTRIC MEMORY TRANSISTORS INCORPORATING AIR GAP ISOLATION STRUCTURES, filed Sep. 28, 2022 ("Patent Application I"), and to U.S. patent application Ser. No. 17/936,320, entitled MEMORY STRUCTURE INCLUDING THREE-DIMENSIONAL NOR MEMORY STRINGS OF JUNCTIONLESS FERROELECTRIC MEMORY TRANSISTORS AND METHOD OF FABRICATION ("Patent Application II"), filed Sep. 28, 2022, which applications are incorporated herein by reference in their entireties.

FIELD OF THE INVENTION

The present invention relates to high-density memory structures and fabrication methods thereof. In particular, the present invention relates to fabrication process for a three-dimensional memory array of ferroelectric storage transistors with an oxide semiconductor channel.

BACKGROUND OF THE INVENTION

A NOR-type memory string includes storage transistors that share a common source region and a common drain region, where each storage transistor can be individually addressed and accessed. U.S. Pat. No. 10,121,553 (the '553 patent), entitled "Capacitive-Coupled Non-Volatile Thin-film Transistor NOR Strings in Three-Dimensional Arrays," issued on Nov. 6, 2018, discloses storage transistors (or memory transistors) organized as 3-dimensional arrays of NOR memory strings formed above a planar surface of a semiconductor substrate. The '553 patent is hereby incorporated by reference in its entirety for all purposes. In the '553 patent, a NOR memory string includes numerous thin-film storage transistors that share a common bit line and a common source line. In particular, the '553 patent discloses a NOR memory string that includes (i) a common source region and a common drain region both running lengthwise along a horizontal direction and (ii) gate electrodes for the storage transistors each running along a vertical direction. In the present description, the term "vertical" refers to the direction normal to the surface of a semiconductor substrate, and the term "horizontal" refers to any direction that is parallel to the surface of that semiconductor substrate. In a 3-dimensional array, the NOR memory strings are provided on multiple planes (e.g., 8 or 16 planes) above the semiconductor substrate, with the NOR memory strings on each plane arranged in rows. For a charge-trap type storage transistor, data is stored in each storage transistor using a charge storage film as the gate dielectric material. For example, the charge storage film may include a tunneling dielectric layer, a charge trapping layer and a blocking layer, which can be implemented as a multilayer including silicon dioxide or oxynitride, silicon-rich nitride, and silicon dioxide, arranged in this order and referred to as an ONO layer. An applied electrical field across the charge storage film adds or removes charge from charge traps in the charge trapping layer, thus altering the threshold voltage of the storage transistor to encode a given logical state in the storage transistor.

Advances in electrically polarizable materials ("ferroelectric materials"), especially those that are being used in semiconductor manufacturing processes, suggest new potential applications in ferroelectric memory circuits. For example, the article "Ferroelectricity in Hafnium Oxide: CMOS compatible Ferroelectric Field Effect Transistors," by T. S. Böscke et al., published in 2011 *International Electron Devices Meeting* (*IEDM*), pp. 24.5.1-24.5.4, discloses a ferroelectric field effect transistor ("FeFET") that uses hafnium oxide as a gate dielectric material. By controlling the polarization direction in a ferroelectric gate dielectric layer, the FeFET may be programmed to have either one of two threshold voltages. Each threshold voltage of the FeFET constitutes a state, for example, a "programmed" state or an "erased" state, that represents a designated logical value. Such an FeFET has application in high-density memory circuits. For example, U.S. Pat. No. 9,281,044, entitled "Apparatuses having a ferroelectric field-effect transistor memory array and related method," by D. V. Nirmal Ramaswamy et al., filed on May 17, 2013, discloses a 3-dimensional array of FeFETs.

SUMMARY OF THE INVENTION

The present disclosure discloses a process for fabrication a memory structure including three-dimensional NOR memory strings of junctionless ferroelectric memory transistors, substantially as shown in and/or described below, for example in connection with at least one of the figures, as set forth more completely in the claims.

In some embodiments, a process suitable for use in fabricating a memory structure comprising storage transistors configured in a NOR memory string above a planar surface of a semiconductor substrate includes: above the planar surface, repeatedly depositing, alternately and one over another, a multilayer and an inter-layer sacrificial layer, each multilayer comprising first and second sacrificial layers and a first isolation layer between the first and second sacrificial layers; forming a first set of trenches in the multilayers and the inter-layer sacrificial layers, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; forming a first liner layer on the sidewalls of the first set of trenches; filling remaining volume of the first set of trenches with a sacrificial filler material; forming a set of excavated shafts in the first set of trenches by removing the sacrificial filler material and the first liner layer from patterned shaft locations, the excavated shafts being spaced apart in the second direction in each trench, each excavated shaft being separated from an adjacent excavated shaft by an isolation area including the sacrificial filler material and the first liner layer; and forming a local word line structure in each of the set of excavated shafts, each local word line structure comprising: (i) an oxide semiconductor layer formed on the sidewalls of the excavated shaft; (ii) a ferroelectric dielectric layer formed on the oxide semiconductor layer; and (iii) a gate conductor layer formed on the ferroelectric dielectric layer.

In other embodiments, a three-dimensional memory structure formed above a planar surface of a semiconductor substrate includes a set of memory stacks arranged along a first direction, each memory stack being separated from each of its immediately neighboring memory stacks along the first direction by a trench, each memory stack and each trench extending in a second direction, the first and second directions being orthogonal to each other and both being substantially parallel to the planar surface of the semiconductor substrate. Each memory stack includes at least one active layer where the active layer includes a first conductive layer and a second conductive layer spaced apart by a first isolation layer. The trenches include trenches of a first type and trenches of a second type, alternately arranged along the first direction. The memory structure further includes a set of shafts provided in the trenches of the first type and arranged spaced apart in the second direction, the shafts extending in a third direction substantially normal to the planar surface of the semiconductor substrate; and a set of local word line structures formed in the set of shafts. Each local word line structure includes (i) an oxide semiconductor layer formed on opposite sidewalls of the shaft in contact with the first and second conductive layers of the memory stack; (ii) a ferroelectric dielectric layer provided adjacent the semiconductor oxide layer and enclosing a perimeter of the shaft; and (iii) a gate conductor layer formed in the shaft adjacent the ferroelectric dielectric layer.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

DETAILED DESCRIPTION OF THE INVENTION

Figure 1A:
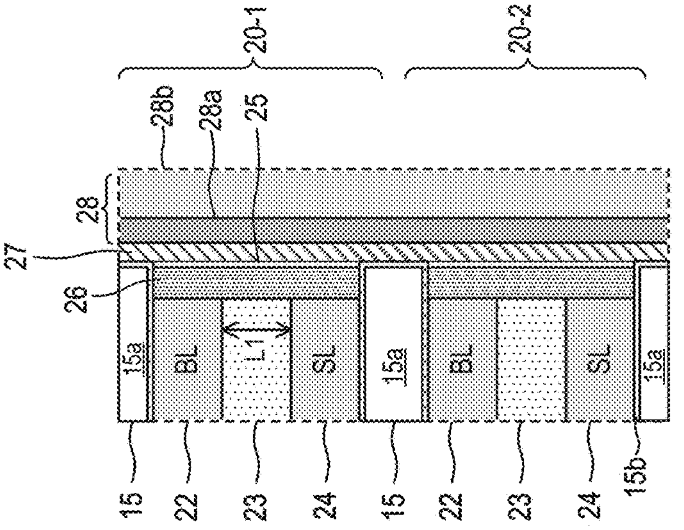
FIG. 1, which includes FIG. 1(*a*), is a perspective view of a memory structure including a 3-dimensional array of NOR memory strings in some embodiments.

In embodiments of the present invention, a fabrication process for a memory structure including three-dimensional arrays of thin-film ferroelectric storage transistors is disclosed. In some embodiments, the ferroelectric storage transistors are organized in three-dimensional arrays of horizontal NOR memory strings. In one aspect of the present invention, the fabrication process uses a high aspect-ratio damascene process to form local word line structures that extends through the multiple layers of the three-dimensional memory structure. In particular, the high aspect-ratio local word line damascene process forms the gate stack layers, including the channel layer, the gate dielectric layer and the gate conductor layer, in the same sequence of additive deposition processes without any of the gate stack layers being subjected to any intervening etching process. In this manner, the integrity of the gate stack layers and their interfaces are well preserved and the transistor characteristics of the ferroelectric storage transistors are enhanced. Furthermore, the high aspect-ratio local word line damascene process enables better control of the isolation between the local word line structures, further enhancing the characteristics of the ferroelectric storage transistors thus formed.

In some embodiments, the ferroelectric storage transistors are thin-film ferroelectric field-effect transistors (FeFETs) having a ferroelectric polarization layer as a gate dielectric layer. The ferroelectric polarization layer, also referred to as a "ferroelectric gate dielectric layer", is formed adjacent an oxide semiconductor layer as a channel region. The ferroelectric storage transistors include source and drain regions—both formed of a metallic conductive material—in electrical contact with the oxide semiconductor channel region. The ferroelectric storage transistors thus formed are each a junctionless transistor without a p/n junction in the channel and in which the threshold voltage is modulated by the polarization of the mobile carriers in the ferroelectric polarization layer. In the memory structure of the present invention, the ferroelectric storage transistors in each NOR memory string are controlled by individual control gate electrodes to allow each storage transistor to be individually addressed and accessed. In some embodiments, the ferroelectric polarization layer is formed of a doped hafnium oxide material and the oxide semiconductor channel region is formed of an amorphous metal oxide semiconductor material.

In the present description, the term "storage transistor" is used interchangeably with "memory transistor" to refer to the transistor device formed in the memory structure described herein. In some examples, the memory structure of the present disclosure including NOR memory strings of randomly accessible storage transistors (or memory transistors) can have applications in computing systems as the main memory where the memory locations are directly accessible by the processors of the computer systems, for instance, in a role served in the prior art by conventional random-access memories (RAMs), such as dynamic RAMs (DRAMS) and static RAMs (SRAMs). For example, the memory structure of the present disclosure can be applied in computing systems to function as a random-access memory to support the operations of microprocessors, graphical processors and artificial intelligence processors. In other examples, the memory structure of the present disclosure is also applicable to form a storage system, such as a solid-state drive or replacing a hard drive, for providing long term data storage in computing systems.

In the present description, the term "oxide semiconductor layer" (sometimes also referred to as a "semiconductor oxide layer" or "metal oxide semiconductor layer") as used herein refers to thin film semiconducting materials made from a conductive metal oxide, such as zinc oxide and indium oxide, or any suitable conductive metal oxides with charge-carriers having mobilities that can be modified or modulated using suitable preparation or inclusion of suitable impurities.

In embodiments of the present invention, the memory structure includes memory stacks where each memory stack includes multiple NOR memory strings formed one on top of another in the vertical direction. In some embodiments, the stacks of NOR memory strings are formed by groups of thin films successively deposited over a planar surface of a semiconductor substrate, each group of thin films being referred to as an "active layer" in the present description. The active layers in each stack of NOR memory strings are provided one on top of another and each active layer is separated from the other active layers by an inter-layer isolation layer. Each active layer includes a common drain line and a common source line that are arranged spaced apart in the vertical direction by a channel spacer isolation layer. Both the common source line and the common drain line extend along a horizontal direction.

The storage transistors in each NOR memory string share the common source line and the common drain line. The channel layer of the storage transistors is formed on the sidewalls of the memory stacks, in contact with the common source line and the common drain line of each NOR memory string. Gate dielectric layers and gate conductor layers of the storage transistors are formed in a vertical direction in narrow operational trenches between the memory stacks to form storage transistors in multiple parallel planes of each stack, a storage transistor being formed at each intersection of a gate conductor layer and the common source line and the common drain line of a memory string. The gate conductor layers are also referred herein as the local word lines (LWL) and the operational trenches are sometimes referred herein as "local word line trenches" or "LWL trenches". That is, the operational or local word line trenches are trenches in which the local word line gate conductors are formed and in which storage transistors are fabricated. As mentioned above, the term "vertical" refers to the direction normal to the surface of a semiconductor substrate, and the term "horizontal" refers to any direction that is parallel to the surface of that semiconductor substrate.

In the present embodiments, the storage transistors in the NOR memory strings are ferroelectric field effect transistors including a ferroelectric thin film as the gate dielectric layer, also referred to as the ferroelectric polarization layer or ferroelectric gate dielectric layer or ferroelectric dielectric layer. In a ferroelectric field effect transistor (FeFET), the polarization direction in the ferroelectric gate dielectric layer is controlled by an electric field applied between the transistor drain terminal and the transistor gate electrode, where changes in the polarization direction alters the threshold voltage of the FeFET. In some embodiments, the electric field is applied to both the transistor drain and source terminals, relative to the transistor gate electrode. For example, the FeFET may be programmed to have either one of two threshold voltages, where each threshold voltage of the FeFET can be used to encode a given logical state. For example, the two threshold voltages of the FeFET can be used to encode a "programmed" state and an "erased" state, each representing a designated logical value. In one example, the programmed state is associated with a higher threshold voltage and the erased state is associated with a lower threshold voltage. In some embodiments, more than two threshold voltages may be established to represent more than two memory states at each FeFET.

In the present description, to facilitate reference to the figures, a Cartesian coordinate reference frame is used, in which the Z-direction is normal to the planar surface of the semiconductor substrate and the X-direction and the Y-direction are orthogonal to the Z-direction and to each other, as indicated in the figures. Moreover, the drawings provided herein are idealized representations to illustrate embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components or elements throughout.

Figure 1:
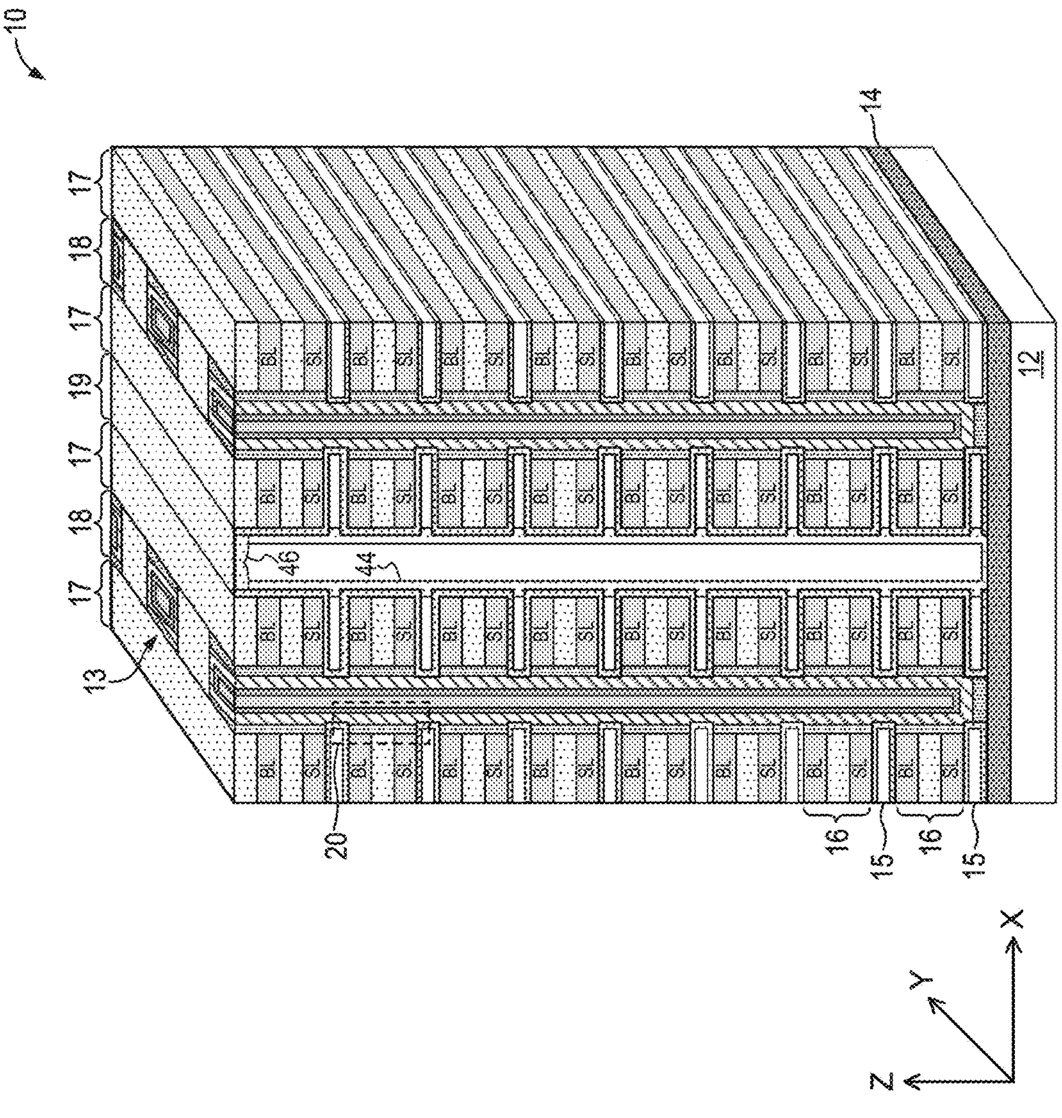

FIG. 1, which includes FIG. 1(*a*), is a perspective view of a memory structure including a 3-dimensional array of NOR memory strings in some embodiments. The memory structure can be used to implement part of a semiconductor memory device in some examples. Referring to FIG. 1, a memory structure 10 includes a number of active layers 16 formed on a planar surface of a semiconductor substrate 12. An insulating layer 14 may be provided between the semiconductor substrate 12 and the active layers 16 formed on the substrate. The active layers 16 are formed one on top of another in the Z-direction (i.e., along a direction normal to the planar surface of the substrate 12) and separated from each other by an inter-layer isolation layer 15. The active layers 16 are divided in the X-direction into narrow strips ("active strips") that are stacked one on top of another to form stacks 17 of active strips ("active stacks") extending in the Y-direction. The active stacks 17 are also referred to as memory stacks in the present description.

In the present embodiment, the active stacks 17 of the memory structure 10 are separated by narrow trenches including operational trenches 18 (also referred to as "LWL trenches") and auxiliary trenches 19. In particular, the active stacks 17 are separated by alternating operational trenches 18 and auxiliary trenches 19. In the present description, operational trenches 18 are narrow trenches between active stacks 17 in which the local word line structures are provided and storage transistors are formed. Auxiliary trenches 19 are narrow trenches between active stacks 17 where no storage transistors are formed.

Each active layer 16 includes first and second low resistivity conductive layers (e.g., titanium nitride (TiN)-lined tungsten (W)) separated by a channel spacer isolation layer, also referred to as a channel spacer dielectric layer, (e.g., silicon dioxide or $SiO_2$). During intermediate processing steps, the active layers may include sacrificial layers (e.g., silicon nitride) to be subsequently replaced by conductive layers. Subsequent processing steps form the channel layers, the gate dielectric layers, and the gate conductor layers in the operational trenches 18 between the separated active stacks. The gate conductor layers and the gate dielectric layers are formed as columnar structures extending in the Z-direction. In the present description, the gate conductor layers are also referred to as "local word lines" and the gate conductor layer with a gate dielectric layer is collectively referred to a local word line (LWL) structure 13. The first and second conductive layers of each active strip form a drain region ("common bit line" or "common drain line") and a source region ("common source line"), respectively, of the storage transistors. In the present embodiment, the storage transistors are formed along the vertical side of the active stacks 17 facing the operational trenches 18. In particular, a storage transistor 20 is formed at the intersection of an active strip with the channel layer and an LWL structure 13. The local word line structures 13 in each trench 18 are separated from each other by a dielectric-filled shaft.

A salient feature of the memory structure 10 of the present invention is that the local word line structure 13 includes the channel layer, the gate dielectric layer and the gate conductor layer formed in each columnar structure. As will be described in more details below, the local word line structure 13 is formed using a damascene process which has the advantages of preserving the integrity of the critical interfaces between the layers of the gate stack, thereby enhancing the electrical characteristics of the storage transistors thus formed. The local word lines damascene process realizes other advantages as well, including a simplified fabrication process with reduced processing steps and enhanced control of the isolation between adjacent LWL structures in the LWL trenches, as will be described in more detail below.

FIG. 1(*a*) illustrates the detail construction of the storage transistor 20 formed in the memory structure 10 in some embodiments. In particular, FIG. 1(*a*) illustrates a pair of storage transistors 20-1 and 20-2 in two adjacent planes of an active stack 17, also referred to as a memory stack. Referring to FIG. 1(*a*), the storage transistor 20 includes a first conductive layer 22 forming the drain region (the common drain line or the common bit line) and a second conductive layer 24 forming the source region (the common source line), the conductive layers being spaced apart by the channel spacer dielectric layer 23. The storage transistor 20 further includes the channel layer 26 formed vertically along the sidewall of the memory stack and in contact with both the first conductive layer 22 and the second conductive layer 24. The gate dielectric layer 27 and the gate conductor layer 28 are formed on the sidewall of the memory stack. The storage transistor 20 is isolated from adjacent storage transistors in the stack by an inter-layer isolation layer 15. As thus configured, along each active strip (in the Y-direction), the storage transistors that share the common source line and the common bit line form a NOR memory string (referred herein as a "Horizontal NOR memory string" or "HNOR memory string").

In embodiments of the present invention, the storage transistors in the memory structure 10 are junctionless ferroelectric storage transistors. Accordingly, each storage transistor 20 includes only conductive layers as the source and drain regions, without any semiconductor layers. The first and second conductive layers are formed using a low resistivity metallic conductive material. In some embodiments, the first and second conductive layers are metal layers, such as a titanium nitride (TiN)-lined tungsten (W) layer, a tungsten nitride (WN)-lined tungsten (W) layer, a molybdenum nitride (MoN) lined molybdenum (Mo) layer, or a liner-less tungsten or molybdenum or cobalt layer, or other metal layers. The channel spacer dielectric layer 23 between the first and second conductive layers may be a dielectric layer, such as silicon dioxide ($SiO_2$). The channel layer 26 is an oxide semiconductor layer. In some examples, the channel layer 26 is formed using an amorphous oxide semiconductor material, such as indium gallium zinc oxide (InGaZnO or IGZO), indium zinc oxide (IZO), indium tungsten oxide (IWO), or indium tin oxide (ITO), or other such oxide semiconductor materials. An oxide semiconductor channel region has the advantage of a high mobility for greater switching performance and without concern for electron or hole tunneling. For example, an IGZO film has an electron mobility of 10.0-100.0 $cm^2/V$, depending on the relative compositions of indium, gallium, zinc and oxygen.

To form the ferroelectric storage transistor, the storage transistor 20 includes a ferroelectric polarization layer 27 in contact with the channel layer 26. The ferroelectric polarization layer 27 (or "ferroelectric dielectric layer") serves as the storage layer of the storage transistor. In some embodiments, an interfacial layer 25 may be provided between the oxide semiconductor channel layer 26 and the ferroelectric polarization layer 27. The interfacial layer 25 is a thin dielectric layer and may be 0.5 nm to 2 nm thick. In some embodiments, the interfacial layer is formed using a material with a high dielectric constant (K) (also referred to as "high-K" material). In some embodiments, the interfacial layer 25 may be a silicon nitride ($Si_3N_4$) layer, or a silicon oxynitride layer, or an aluminum oxide ($Al_2O_3$) layer. In one example, the interfacial layer, if present, may have a thickness of 1.5 nm when the ferroelectric polarization layer has a thickness of 4-5 nm. The inclusion of the interfacial layer 25 in FIG. 1(*a*) is illustrative only and not intended to be limiting. The interfacial layer 25 is optional and may be omitted in other embodiments of the present invention. In other embodiments, the interfacial layer 25, when included, may be formed as a multi-layer of different dielectric materials. In the present description, a material with a high dielectric constant or a "high-K material" refers to a material with a dielectric constant larger than the dielectric constant of silicon dioxide or larger than a dielectric constant of 3.9.

In some embodiments, the ferroelectric polarization layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric polarization layer is a material selected from: zirconium-doped hafnium oxide (HZO), silicon-doped hafnium oxide (HSO), aluminum zirconium-doped hafnium oxide (HfZrAlO), aluminum-doped hafnium oxide ($HfO_2$:Al), lanthanum-doped hafnium oxide ($HfO_2$:La), hafnium zirconium oxynitride (HfZrON), hafnium zirconium aluminum oxide (HfZrAlO), and any hafnium oxide that includes zirconium impurities.

The ferroelectric polarization layer contacts the channel layer 26 on one side and the gate conductor layer 28 on the opposite side. In some embodiments, the gate conductor layer 28 includes a conductive liner **28*a* as an adhesion layer and a low resistivity conductor 28*b*. In some examples, the conductive liner 28*a* is a titanium nitride (TiN) layer, a tungsten nitride (WN) layer, or a molybdenum nitride (MoN), and the conductor 28*b* is formed using tungsten or molybdenum, or other metals. In some cases, the conductive liner 28*a* is not needed and the gate conductor layer 28 includes only the low resistivity conductor 28*b*, such as a liner-less tungsten or molybdenum layer. In other examples, the conductor 28*b* can be heavily doped n-type or p-type polysilicon, which can be used with or without the conductive liner. The gate conductor layer 28, including the conductive liner 28***a* (if any) and the conductor 28*b*, together forms the control gate electrode of the storage transistor and functions as the local word line in the memory structure.

As thus constructed, the oxide semiconductor channel layer 26 forms an N-type, unipolarity channel region where the conductive layers 22, 24, forming the drain and source terminals, directly contact the channel region. The ferroelectric storage transistor thus formed is a depletion mode device where the transistor is normally on (i.e., conducting) and can be turned off (i.e., non-conducting) by depleting the N-type carriers in the channel region. The threshold voltage of the ferroelectric storage transistor is a function of the thickness (X-direction) of the oxide semiconductor channel layer 26. That is, the threshold voltage of the ferroelectric storage transistor is the amount of voltage necessary to deplete the carriers within the thickness of the oxide semiconductor channel region to shut off the ferroelectric storage transistor.

Each storage transistor 20 is isolated from adjacent storage transistors along an active stack (in the Z-direction) by the inter-layer isolation layer 15. In the present embodiment, the inter-layer isolation layer 15 is an air gap isolation formed by an air gap cavity 15*a* and an optional air gap liner 15*b*. The air gap liner 15*b* is a dielectric layer used to cover or passivate the exposed surface of the air gap cavity 15*a*. In some embodiments, the air gap liner 15*b* is a silicon nitride layer or an aluminum oxide ($Al_2O_3$) layer. The air gap liner 15*b* may be 1 nm-3 nm thick. In FIG. 1(*a*), elements are sometimes exaggerated in size for illustrative purposes only. It is understood that the depictions in this and other figures are not necessarily to scale. The air gap cavities 15*a* forming the inter-layer isolation layer 15 provides effective isolation between adjacent storage transistors 20 along a memory stack. In embodiments of the present invention, the inter-layer isolation layer 15 is also used to provide physical separation between the channel layer 26 of one storage transistor and the channel layer of the storage transistors above or below it in the same memory stack, thereby providing isolation of each storage transistor in a memory stack.

Returning to FIG. 1, in the exemplary embodiment as shown, the memory structure 10 includes a dielectric layer 44 which serves as a capping layer to cap the air gap cavities 15*a*. In some embodiments, the dielectric layer 44 is a non-conformally deposited dielectric layer, such as a silicon dioxide ($SiO_2$) layer or silicon nitride ($Si_3N_4$), and is formed to cap the ends of the inter-layer cavities facing the auxiliary trenches 19. The memory structure 10 further includes a dielectric layer 46 as a capping layer to cap the top portions of the auxiliary trenches 19. In some embodiments, the dielectric layer 46 is the same dielectric material as the dielectric layer 44. As thus formed, the memory structure 10 includes two levels of air gap isolation. A first level of air gap isolation is provided as the inter-layer air gap isolation 15*a* between the active layers 16 in the memory stacks. The first level of air gap isolation provides isolation between storage transistors formed in a memory stack 17. The second level of air-gap isolation is provided in the auxiliary trenches 19 and provides isolation and reduces the parasitic capacitance between adjacent memory stacks 17.

In embodiments of the present invention, the three-dimensional array of NOR memory strings of ferroelectric storage transistors can be applied to implement a non-volatile memory device or a quasi-volatile memory device. For example, a quasi-volatile memory has an average retention time of greater than 100 ms, such as about 10 minutes or a few hours, whereas a non-volatile memory device may have a minimum data retention time exceeding 5 years. As a quasi-volatile memory, the ferroelectric storage transistor 20 may require refresh from time to time to restore the intended programmed and erased polarization states. For example, the ferroelectric storage transistors 20 in memory structure 10 may be refreshed every few minutes or hours. In particular, the ferroelectric storage transistors in the present disclosure can form a quasi-volatile memory device where the refresh intervals can be on the order of hours, significantly longer than the refresh intervals of DRAMs which require much more frequent refreshes, such as in tens of milli-seconds.

A salient feature of the ferroelectric storage transistor 20 is that the storage transistor can have a very short channel length, which is operative to increase the voltage separation between the different threshold voltages, while the memory structure 10 can be manufactured without requiring costly lithography techniques to realize the short channel length. In particular, the channel length of the ferroelectric storage transistor 20 is determined by the thickness L1 of the channel spacer dielectric layer 23 (FIG. 1(*a*)). The thickness L1 can be accurately controlled during the deposition of the sublayers forming the initial memory stack. The ability to control the thickness L1 by deposition process, together with the very low channel leakage of oxide semiconductor channel layer, make it possible to provide a ferroelectric storage transistor 20 with very short channel length, such as a channel length of 5 nm, without needing to employ costly lithography such as extreme ultraviolet scanners (EUV) that are necessary to pattern short channels in planar transistors. In some embodiments, the thickness L1, or the channel length of the storage transistor, can be between 5 nm and 20 nm, or between 5-7 nm.

Referring again to FIG. 1, to complete the memory circuit, various types of circuitry are formed in or at the surface of the semiconductor substrate 12 to support the operations of the HNOR memory strings. Such circuits are referred to as "circuits under array" ("CuA") and may include digital and analog circuitry such as decoders, drivers, sense amplifiers, sequencers, state machines, exclusive OR circuits, memory caches, multiplexers, voltage level shifters, voltage sources, latches and registers, and connectors, that execute repetitive local operations such as processing random address and executing activate, erase, program, read, and refresh commands with the memory arrays formed above the semiconductor substrate 12. In some embodiments, the transistors in the CuA are built using a process optimized for the control circuits, such as an advanced manufacturing process that is optimized for forming low-voltage and faster logic circuits. In some embodiments, the CuA is built using fin field-effect transistors (FinFET) or gate-all-around field-effect transistors (GAAFET) to realize a compact circuit layer and enhanced transistor performance.

In some embodiments, the CuA provides the data path to and from the memory array and further to a memory controller that may be built on the same semiconductor substrate as the CuA. Alternatively, the memory controller may reside on a separate semiconductor substrate, in which case the CuA and the associated data path are electrically connected to the memory controller using various bonding techniques. In some examples, the memory controller includes control circuits for accessing and operating the storage transistors in the memory array connected thereto, performing other memory control functions, such as data routing and error correction, and providing interface functions with systems interacting with the memory array.

The memory structure 10 of FIG. 1 illustrates a construction of a 3-dimensional array of NOR memory strings in some embodiments. In some embodiments, the memory structure 10 is fabricated in a process that realizes advantageous features for the memory structure. First, the memory structure 10 is formed so that the storage transistors in the 3-dimensional array of NOR memory strings are individually isolated from other storage transistors. In particular each storage transistor is isolated in the vertical direction by the inter-layer isolation layer and also optionally isolated in the horizontal direction by isolating the channel layer to each local word line structure 13, as shown in FIG. 1. The performance characteristics of the storage transistors can be enhanced by individually isolating each storage transistors. Second, the channel layer can be deposited conformally and then channel separation between active layers in the memory stacks is realized by etching the channel backside through access openings formed by a sacrificial layer. This results in a simplified and more reliable process for forming the channel layer. Third, after the removal of the inter-layer sacrificial layer for channel separation, the remaining cavities between active layers can form air gap isolation between the active layers, realizing better isolation than most dielectric materials.

In embodiments of the present disclosure, the memory structure includes a memory array portion constructed as described above to form the 3-dimensional array of NOR memory strings. To complete the memory device, the memory structure includes staircase portions provided at the ends of the memory strings (in the Y-directions). The thin-film storage transistors of the NOR memory strings are formed in the memory array portion while the staircase portions, on opposite sides of the array portion, include staircase structures to provide connections through conductive vias to the common bit lines and, optionally, the common source lines, of the NOR memory strings. In some embodiments, the common source lines are pre-charged to serve as virtual voltage reference source during programming, reading and erase operations, thereby obviating the need for a continuous electrical connection with the support circuitry during such operations. In the present description, the common source lines are described as being electrically floating to refer to the absence of a continuous electrical connection to the common source lines. In embodiments of the present disclosure, various processing steps for forming staircase structures in the memory structure can be used. The processing steps for forming the staircase structures can be before, after, or interleaved with the processing steps for forming the memory array portion.

The memory structure 10 of FIG. 1 illustrates the construction of a memory array including a three-dimensional array of NOR memory strings. The memory structure 10 can be used as a building block for forming a high capacity, high density memory device. In embodiments of the present disclosure, the memory structure 10 represents a modular memory unit, referred to as a "tile," and a memory device is formed using an array of the modular memory units. In one exemplary embodiment, a memory device is organized as a two-dimensional array of tiles, arrayed along the X- and Y-directions, where each tile includes a three-dimensional array of ferroelectric storage transistors with support circuitry for each tile formed under the respective tile. More specifically, a memory device includes multiple memory arrays of thin-film ferroelectric storage transistors organized as a 2-dimensional array of "tiles" (i.e., the tiles are arranged in rows and columns) formed above a planar semiconductor substrate. Each tile can be configured to be individually and independently addressed or larger memory segments (e.g., a row of tiles or a 2-dimensional block of tiles) may be created and configured to be addressed together. In some examples, each row of tiles (a "tile row") may be configured to form an operating unit, which is referred to as a "bank." A group of banks, in turn, form a "bank group." In that configuration, the banks within a bank group may share data input and output buses in a multiplexed manner. As thus configured, the tile is a modular unit that allows flexibility in configuring the memory module to adapt to application requirements.

Figure 2:
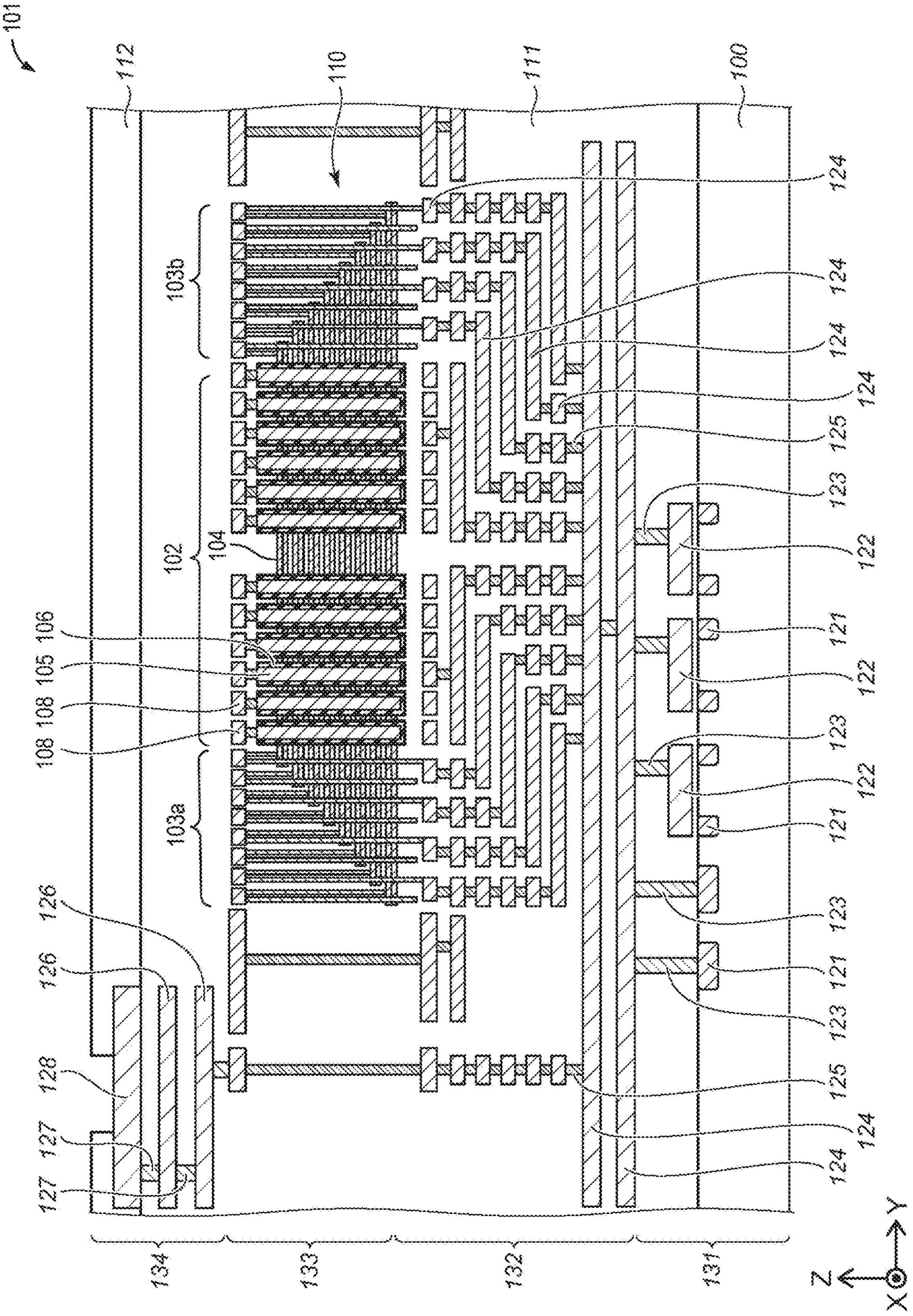
FIG. 2 illustrates a cross-sectional view of a tile in a memory device in the Y-Z plane in embodiments of the present invention.

FIG. 2 illustrates a cross-sectional view of a tile in a memory device in the Y-Z plane in embodiments of the present invention. Referring to FIG. 2, a tile 101 is formed on a semiconductor substrate 100. The memory structure of the tile 101 is formed in an insulating film 111 with a passivation film 112 formed thereon. In some embodiments, the insulating film 111 is formed of silicon dioxide ($SiO_2$) and the passivation film 112 is formed of polyimide. The memory structure includes a three-dimensional array of junctionless ferroelectric storage transistors ("memory array"), constructed as described with reference to the memory structure 10 of FIG. 1.

P-type or N-type diffusion regions 121 are formed in the upper surface of the semiconductor substrate 100. Other structures (not shown in FIG. 2), such as isolation structures or shallow trench isolation (STI) structures, may also be formed in the semiconductor substrate 100. Gate electrodes 122 are formed on and insulated from the semiconductor substrate 100 by a gate dielectric layer. For example, the gate dielectric layer may be a thin silicon oxide layer. The gate electrodes 122 together with the P-type and N-type diffusion regions 121 form transistors in the semiconductor substrate 100, where the transistors can be used to form circuit elements. For example, the transistors can be used to form the support circuitry for operating the storage transistors in the 3-D NOR memory array formed in the tile 101. The circuit elements are interconnected to form the support circuitry by contacts 123 connecting to one or more layers of interconnects 124 and vias 125 formed in the insulating film 111 in a lower interconnect portion 132. In some embodiments, the support circuitry of the semiconductor memory device is formed in the circuit element portion 131 and the lower interconnect portion 132.

In the tile 101, a 3-D NOR memory array 110 is formed in a memory array portion 133. An upper interconnect portion 134 is formed on the memory array portion 133. Interconnects 126 and vias 127 are provided in the insulating film 111 in the upper interconnect portion 134 for forming additional electrical connections. In some embodiments, a conductive pad 128 is provided in the upper interconnect portion 134 for connecting to circuit elements external to the semiconductor memory device. For instance, the passivation film 112 is formed on and encapsulates the upper interconnect portion 134 with an opening exposing at least a part of the conductive pad 128.

In the memory array portion 133, the thin-film storage transistors are organized as a three-dimensional array of NOR memory strings in the memory array portion 102. The memory array portion 102 is provided between staircase portions 103*a* and 103*b*. Connections through conductive vias to common drain lines and, optionally, common source lines, of the NOR memory strings are provided in the staircase portions 103*a* and 103*b*. In some embodiments, the common source lines are precharged and then held at a relatively constant voltage to serve as a virtual voltage reference during programming, erase and read operations, thereby obviating the need for a continuous electrical connection with the support circuitry during such operations. In FIG. 2, the array portion 102 and the staircase portions 103*a* and 103*b* are not drawn to scale. For example, the array portion 102 maybe much larger than the staircase portions 103*a* and 103*b*.

In the memory array portion 102, the thin film storage transistors are formed at the intersection of the common drain line and common source line (collectively referenced by numeral 104) and a local word line 105. A gate dielectric layer 106 is formed between the conductive local word line and the channel layer (not shown in FIG. 2). With the common drain lines and common source lines arranged in multiple planes running in the Y-direction and the local word lines 105 formed as columnar structure extending in the Z-direction and arranged in the Y-direction, storage transistors are formed in a three-dimensional array on multiple planes in the Z-direction, along each memory string in the Y-direction and arranged in multiple rows in the X-direction. In FIG. 2, global word lines conductors 108 provide electrical connectivity between circuits 122 under memory array 110, and local word lines 105 associated with the three-dimensional memory stacks.

In the above-described embodiments, the supporting circuitry is described as being formed under the memory array portion 133. Such configuration is illustrative only and not intended to be limiting. For example, in other embodiments, both the memory array portion and the supporting circuitry may be directly formed on the semiconductor substrate 100. In such a case, for example, the supporting circuitry may be located at the periphery of the memory array portion. In other embodiments, the supporting circuitry may be formed on another semiconductor substrate. In such a case, for example, the semiconductor substrate in which the memory array portion is formed and the semiconductor substrate in which the supporting circuitry is formed are bonded after formation of the respective memory and circuit elements.

FIG. 2 illustrates one exemplary embodiment of a tile or a modular unit of a memory array. The depiction of the tile 101 in FIG. 2 is illustrative only and not intended to be limiting. FIG. 2 is provided to illustrate the incorporation of the memory structure 10 of FIG. 1 to form a modular memory unit ("tile) which can then be used to form a memory device including multiple arrays of three-dimensional junctionless ferroelectric storage transistors to provide the desired memory capacity at a high-density level.

As thus configured, the memory device described herein implements a tile-based architecture including an arrangement of independently and concurrently operable arrays or tiles of memory transistors where each tile includes memory transistors that are arranged in a three-dimensional array supported by a localized modular control circuit operating the memory transistors in the tile. The tile-based architecture enables concurrent memory access to multiple tiles in the memory device, which enables independent and concurrent memory operations to be carried out across multiple tiles. The tile-based concurrent access to the memory device has the benefits of increasing the memory bandwidth and lowering the tail latency of the memory device by ensuring high availability of storage transistors.

In embodiments of the present invention, a fabrication process for forming the memory structure 10 of FIG. 1 uses a high aspect-ratio damascene process to form local word line structures that extends through the multiple layers of the three-dimensional memory structure. Furthermore, the high aspect-ratio local word line damascene process forms the gate stack layers, including the channel layer, the gate dielectric layer and the gate conductor layers, in the same sequence of additive deposition processes without exposing any of the gate stack layers to intervening etching processes. Accordingly, the integrity of the interfaces between the gate stack layers are well preserved and the electrical characteristics of the storage transistors thus formed are enhanced.

Figure 3:
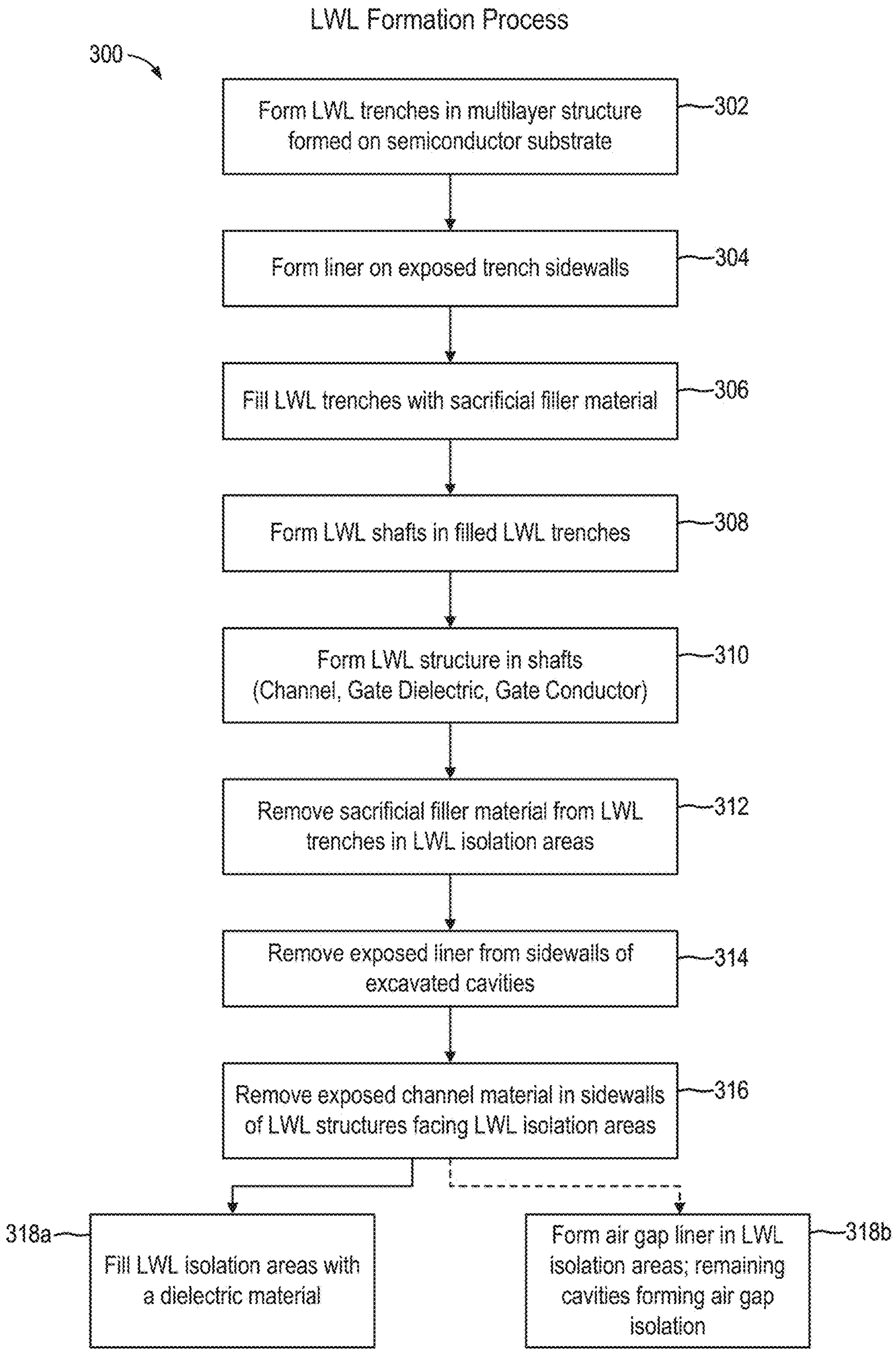
FIG. 3 is a flowchart illustrating a local word line formation process in embodiments of the present invention.

FIG. 3 is a flowchart illustrating a local word line formation process in embodiments of the present invention. The local word line formation process 300 of FIG. 3 forms part of the fabrication process for forming the memory structure 10 of FIG. 1. The local word line formation process 300 will be described with reference to FIGS. 4(*a*) to 4(*s*) which illustrate the fabrication process for forming the memory structure 10 of three-dimensional HNOR memory strings.

Figure 4A:
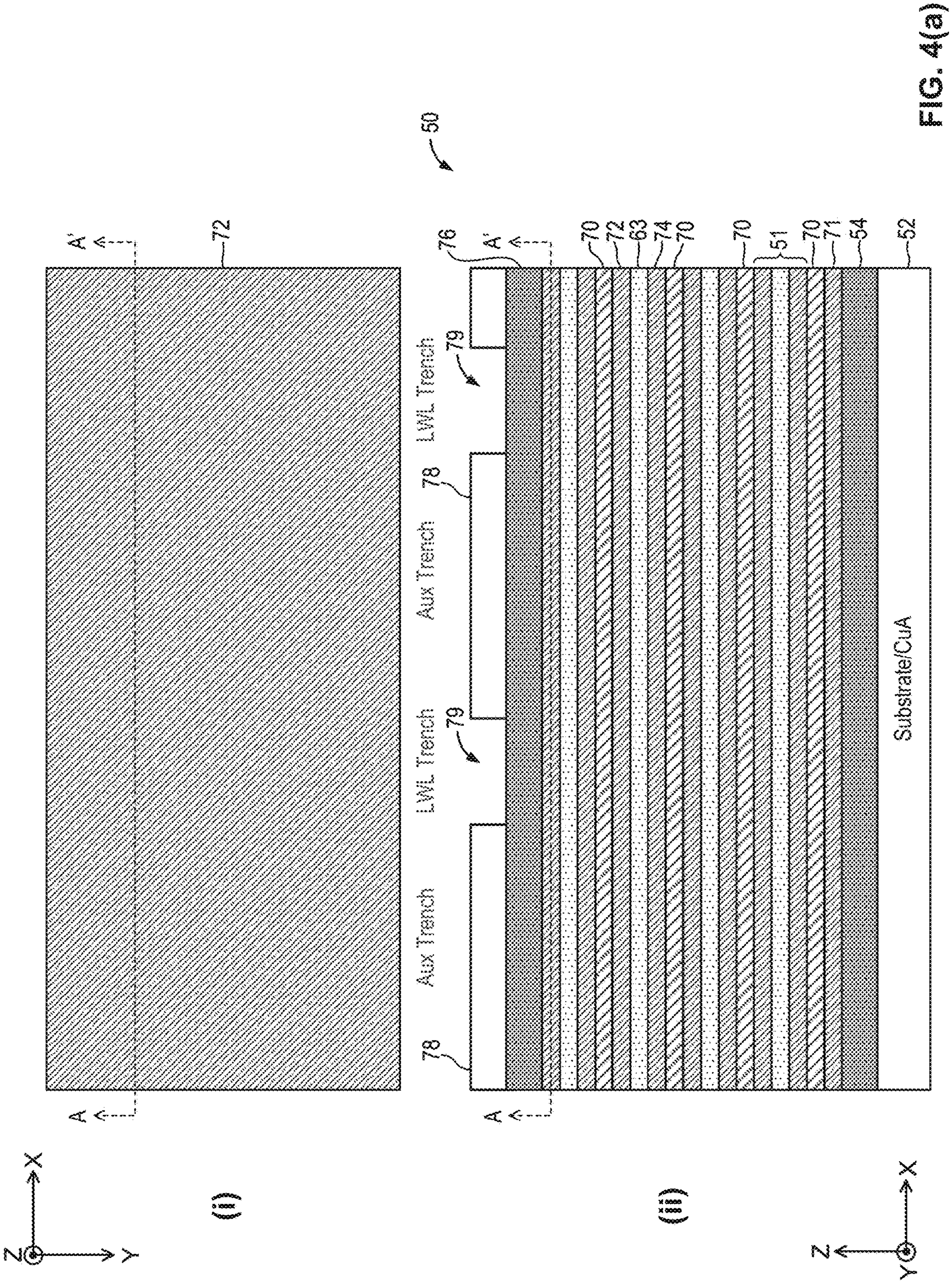
FIGS. 4(*a*) to 4(*t*), including FIGS. 4(*e*1) and 4(*p*1), illustrate a process for fabricating a memory structure including HNOR memory strings in embodiments of the present invention.
Figure 4B:
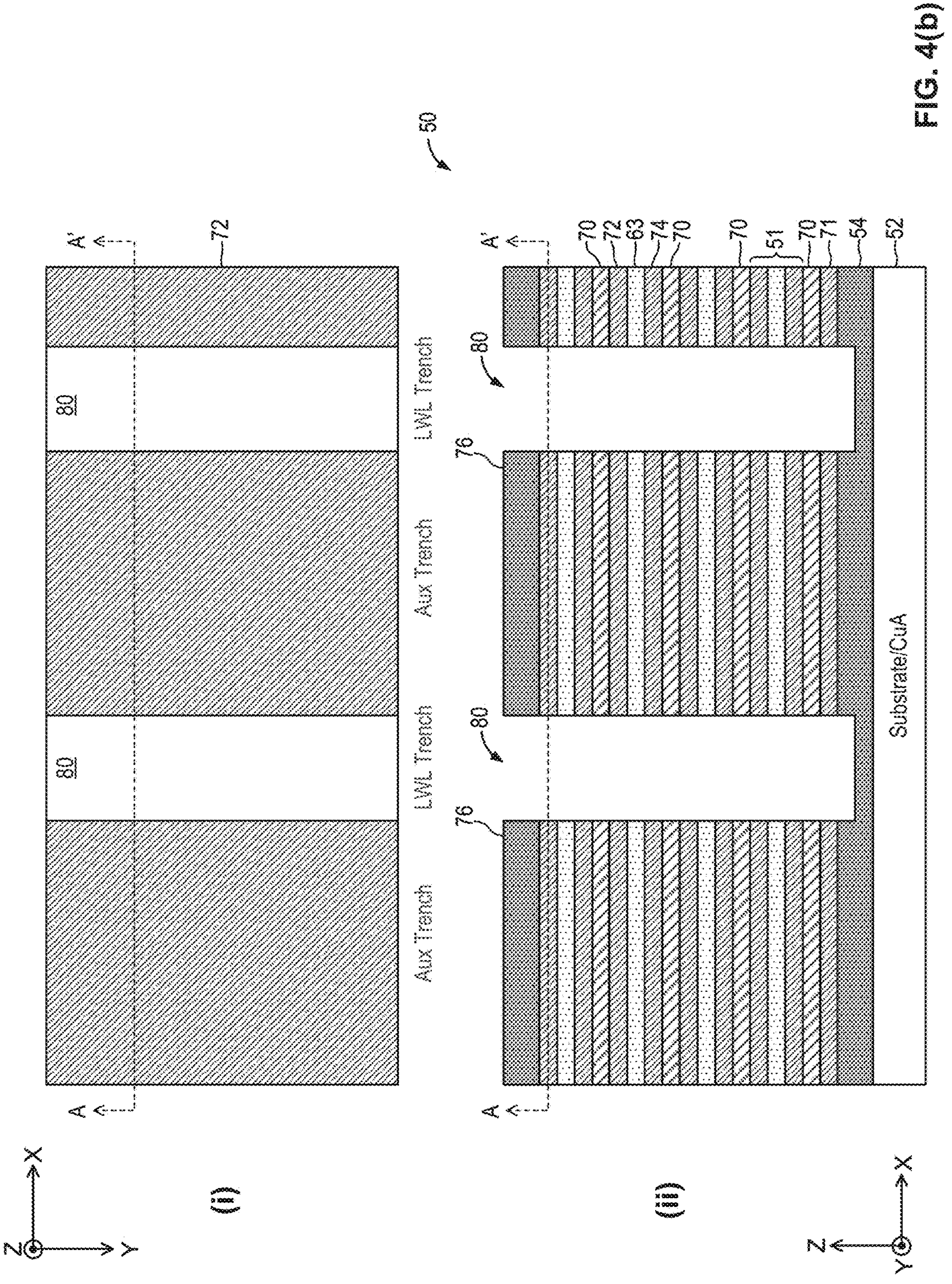
Figure 4C:
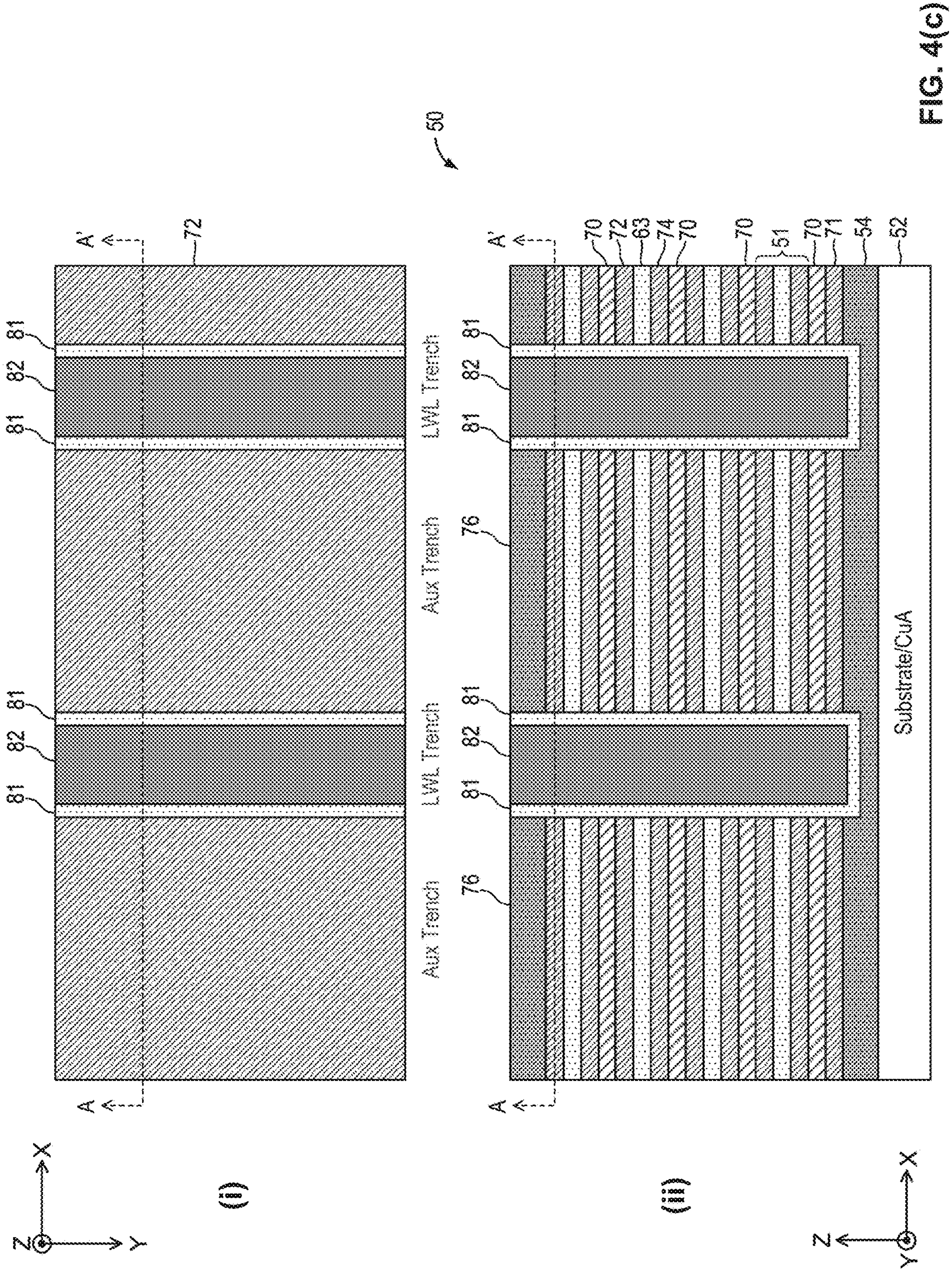
Figure 4D:
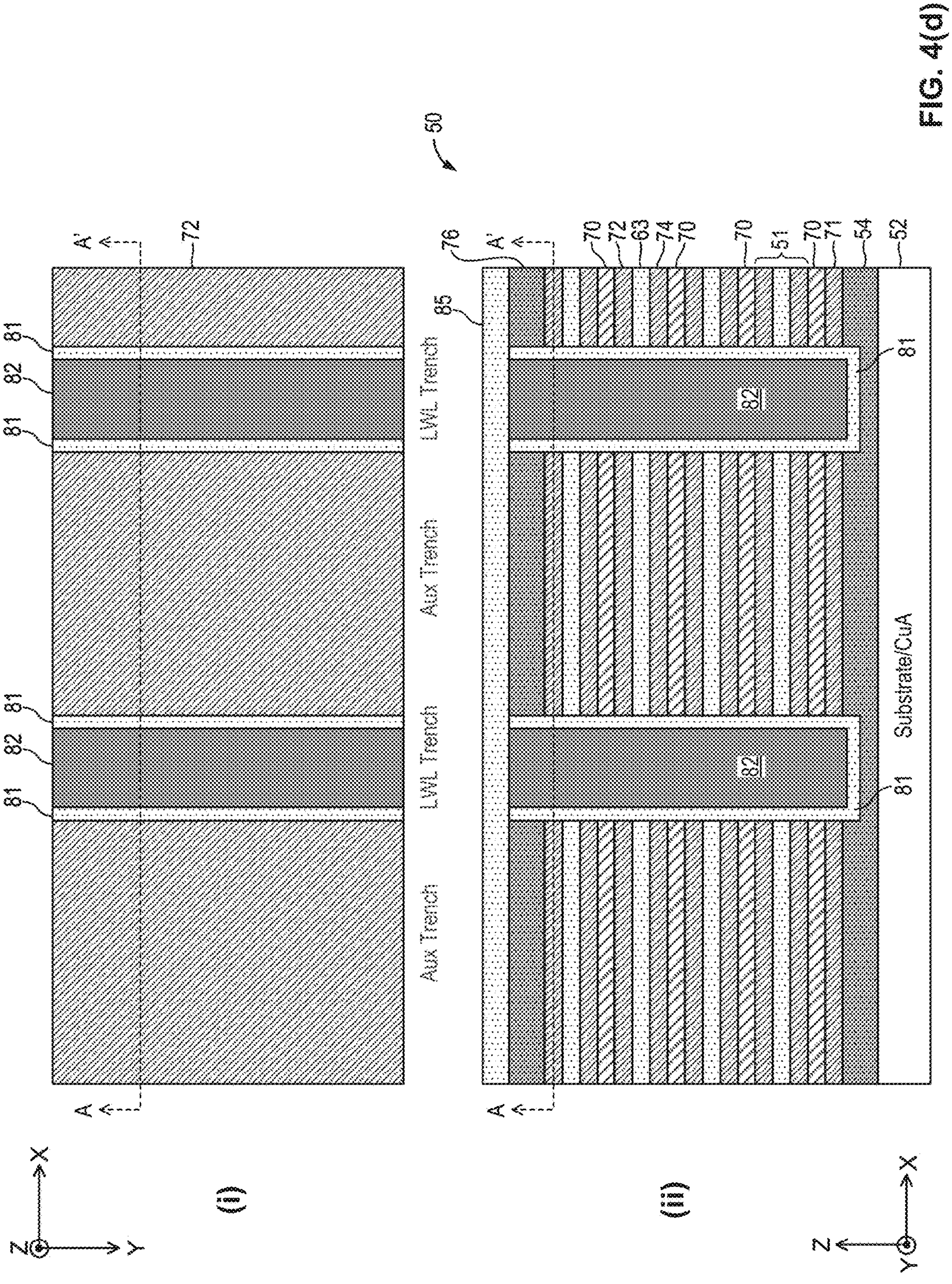
Figure 4E:
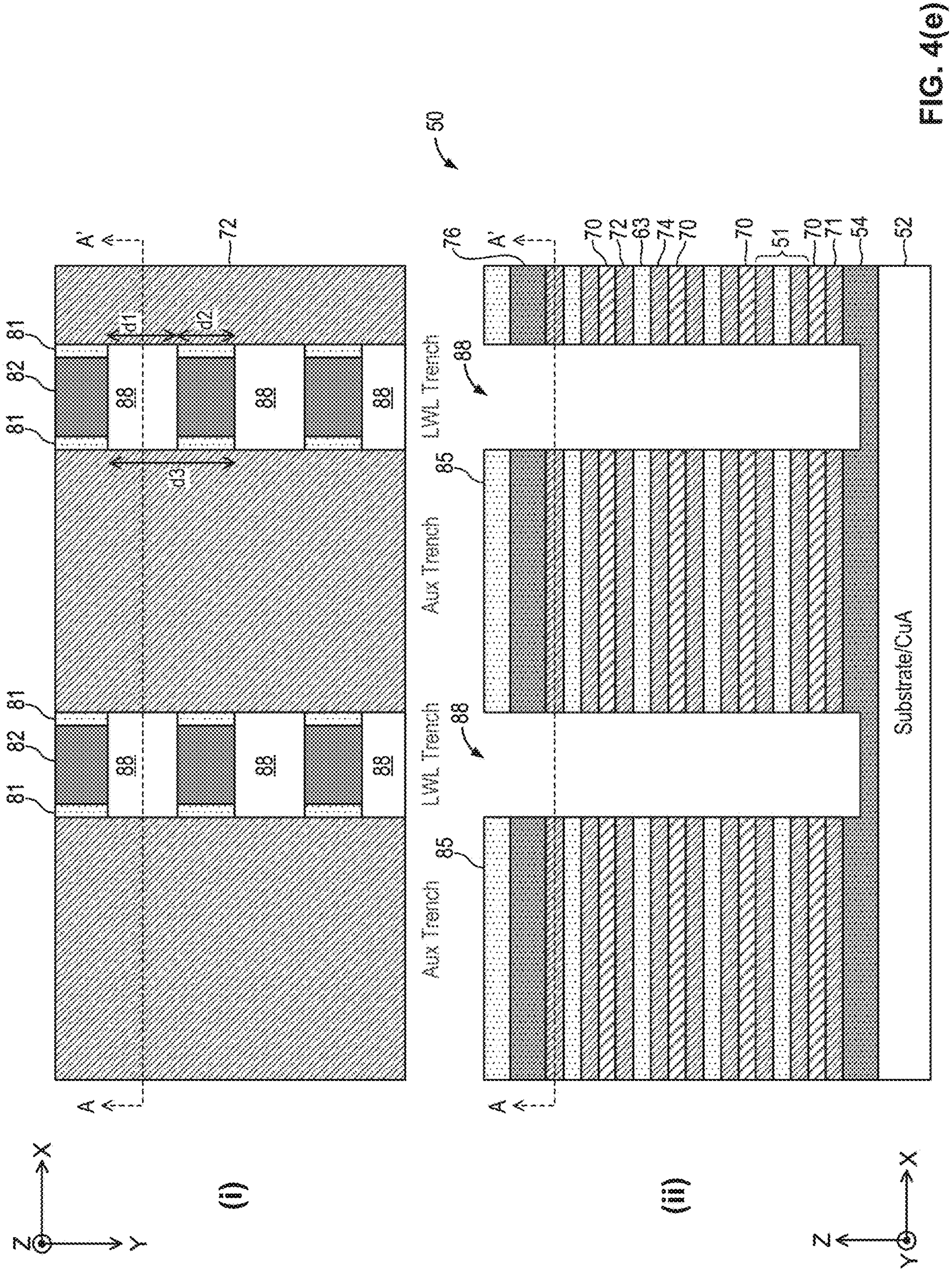
Figure 4:
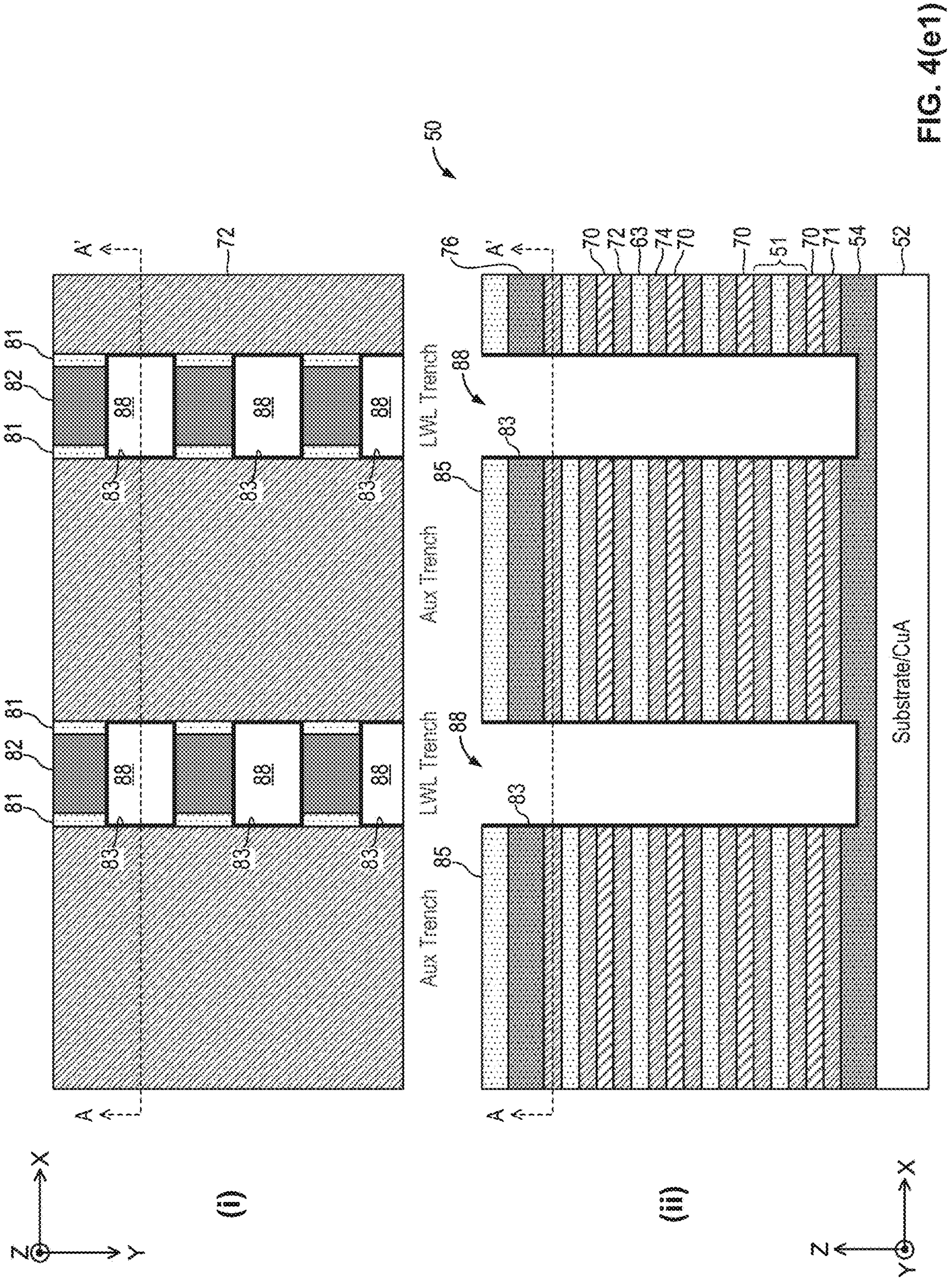
Figure 4F:
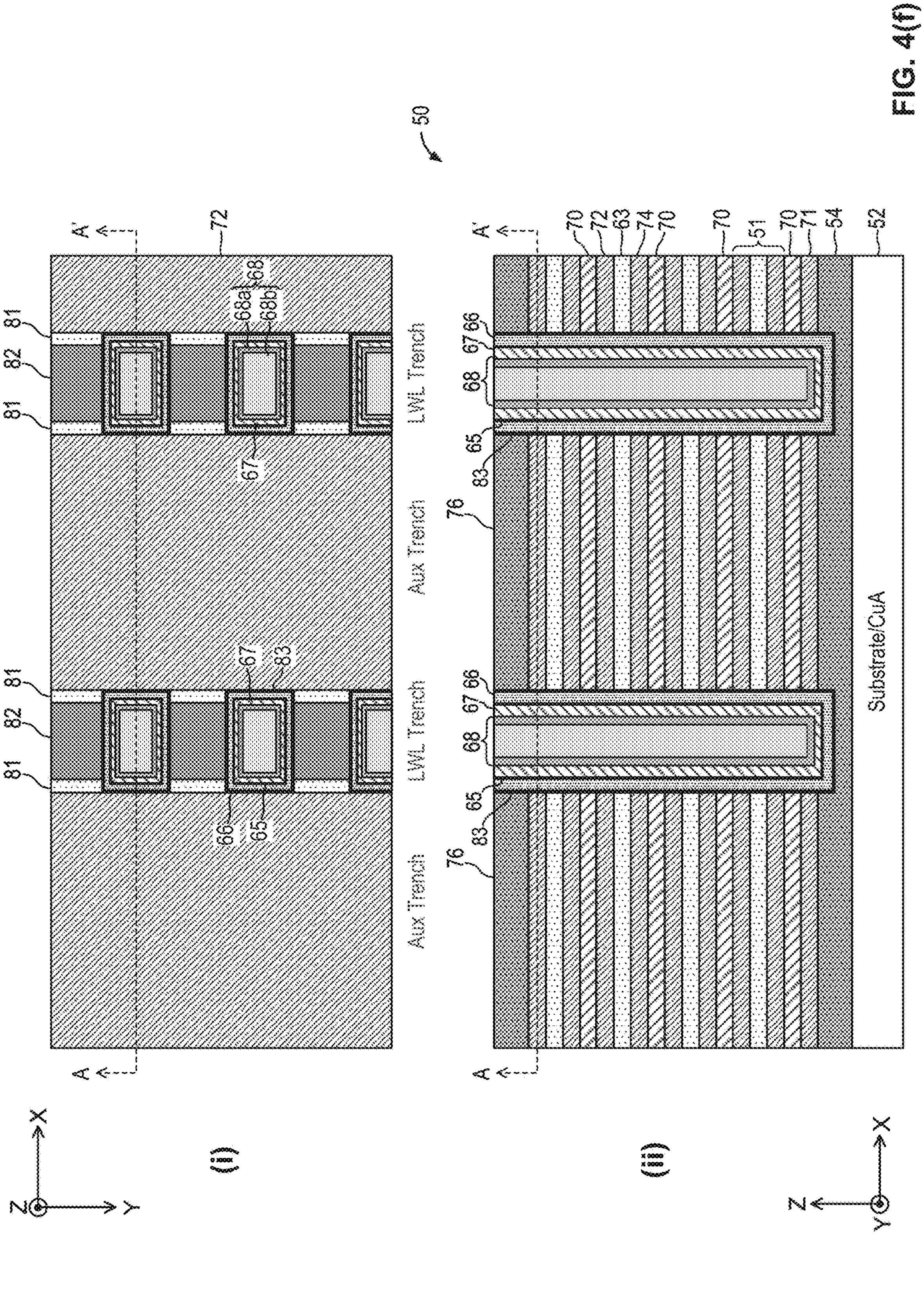
Figure 4G:
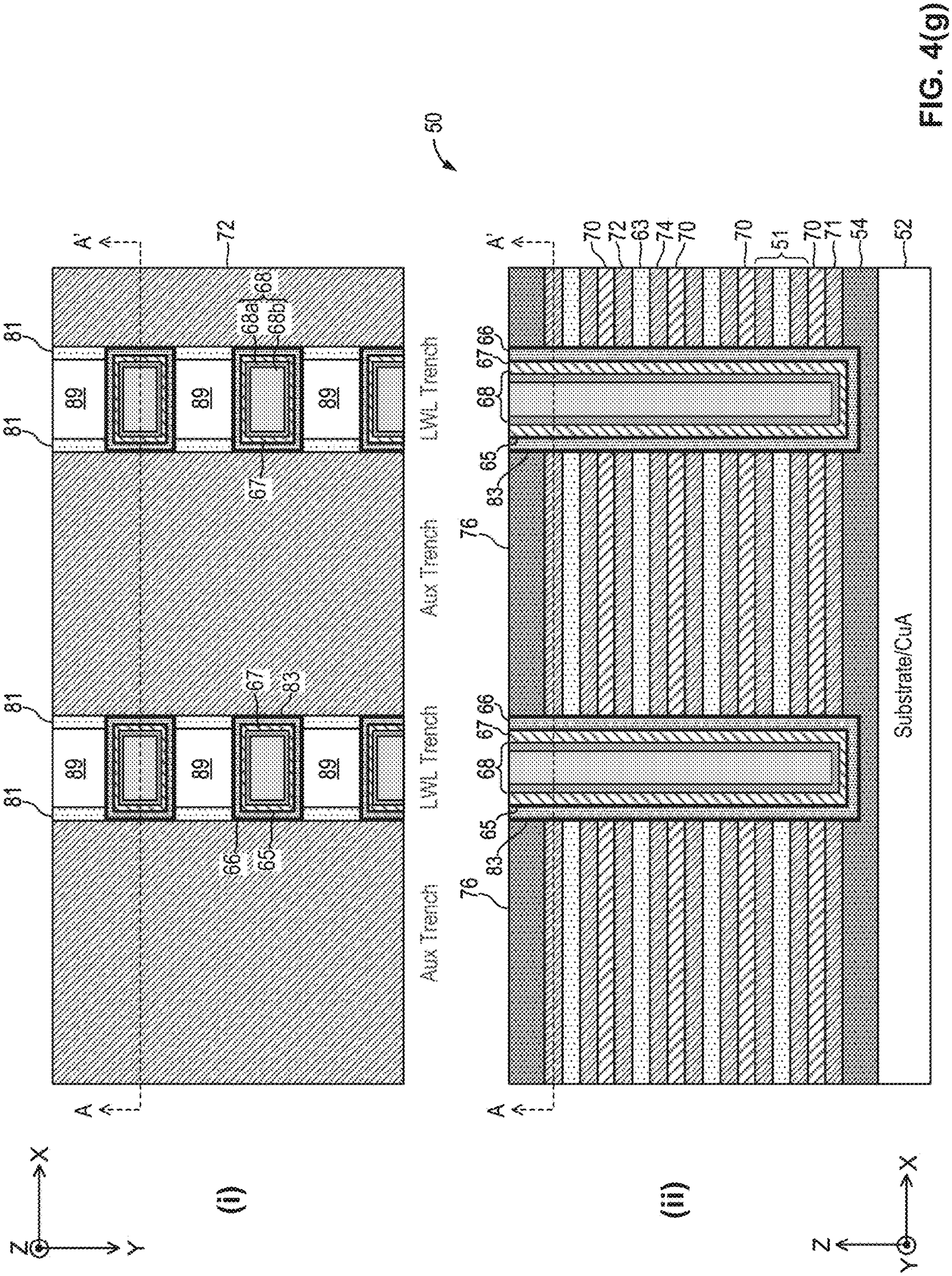
Figure 4H:
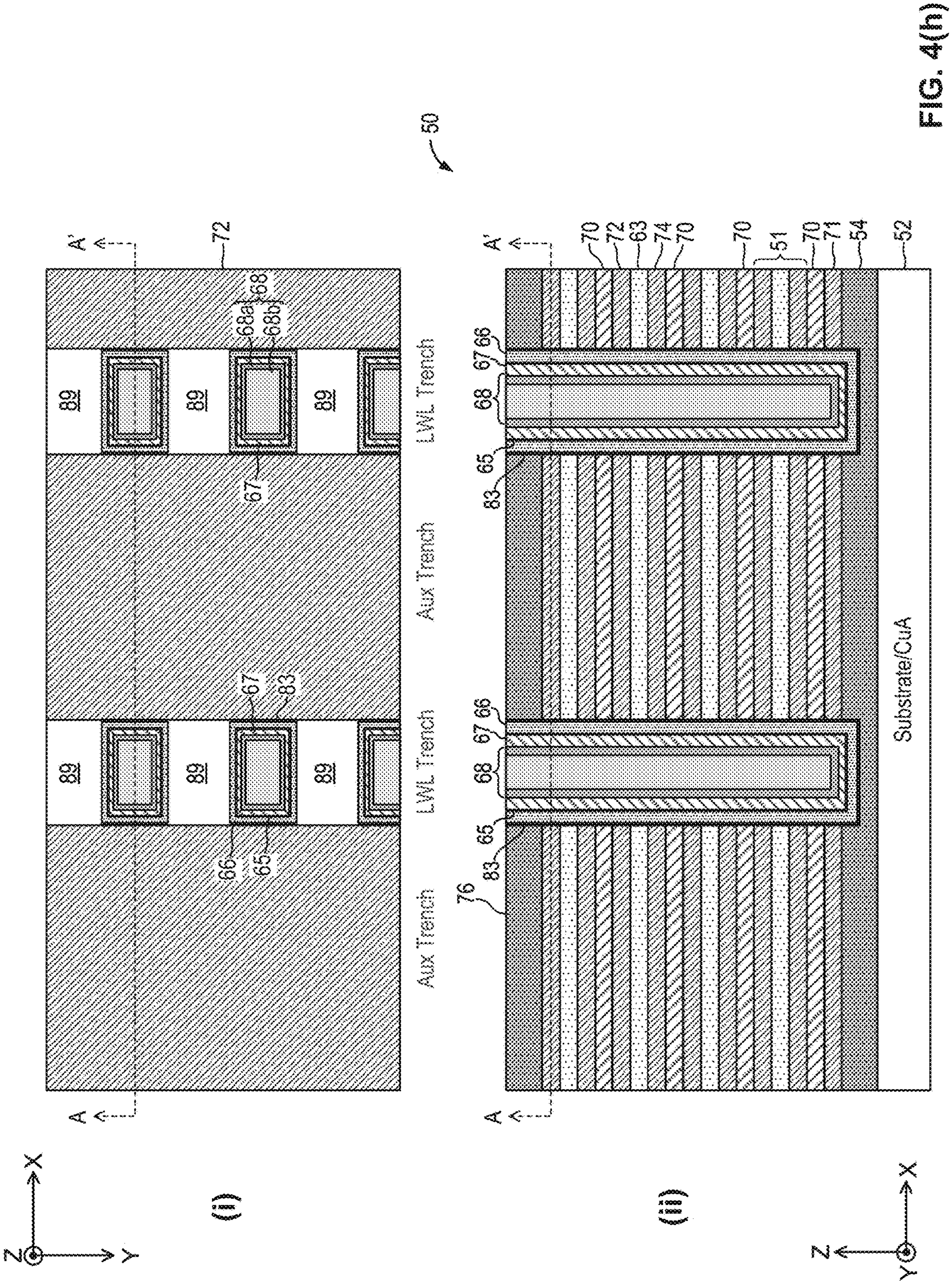
Figure 4I:
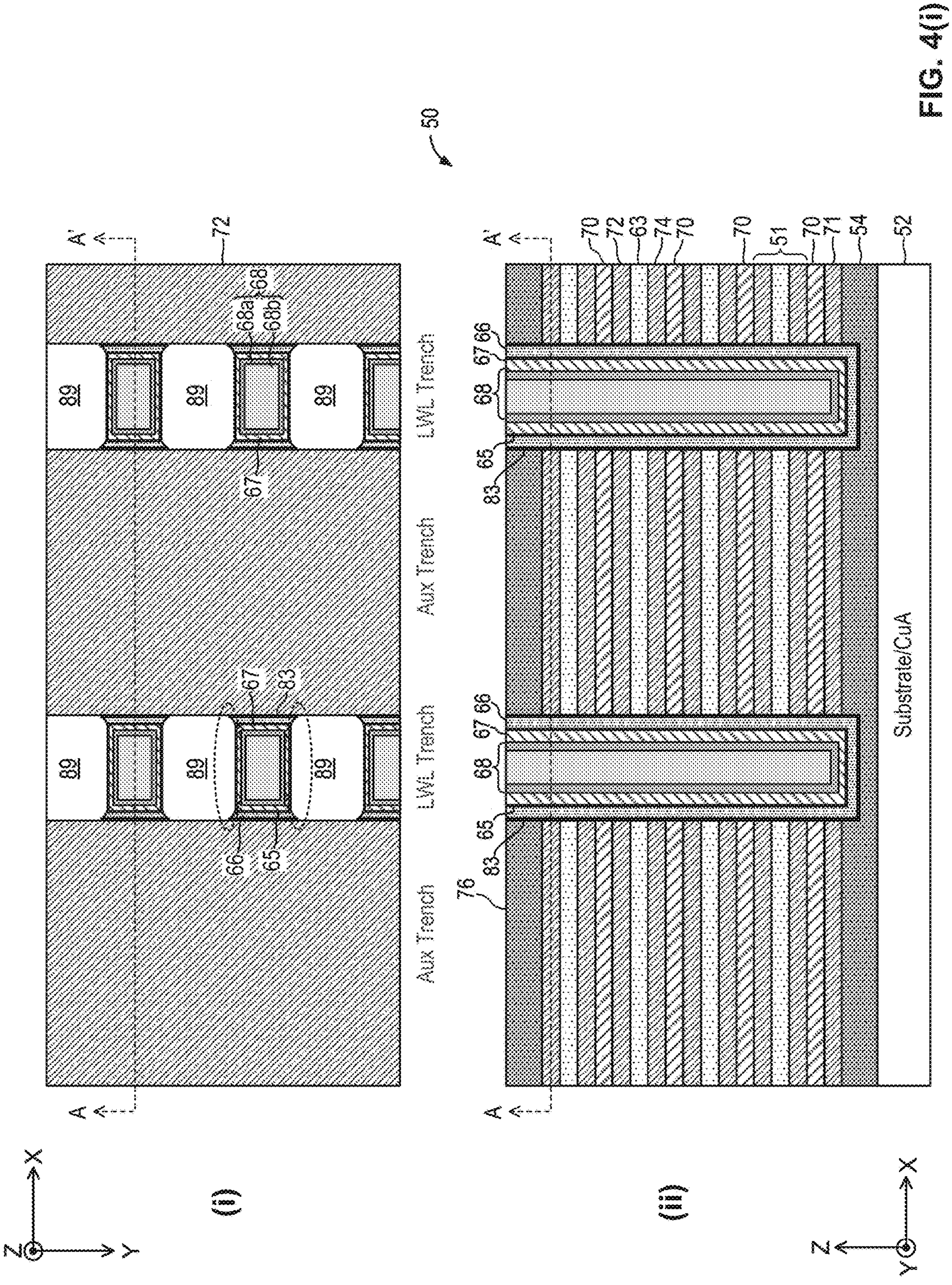
Figure 4J:
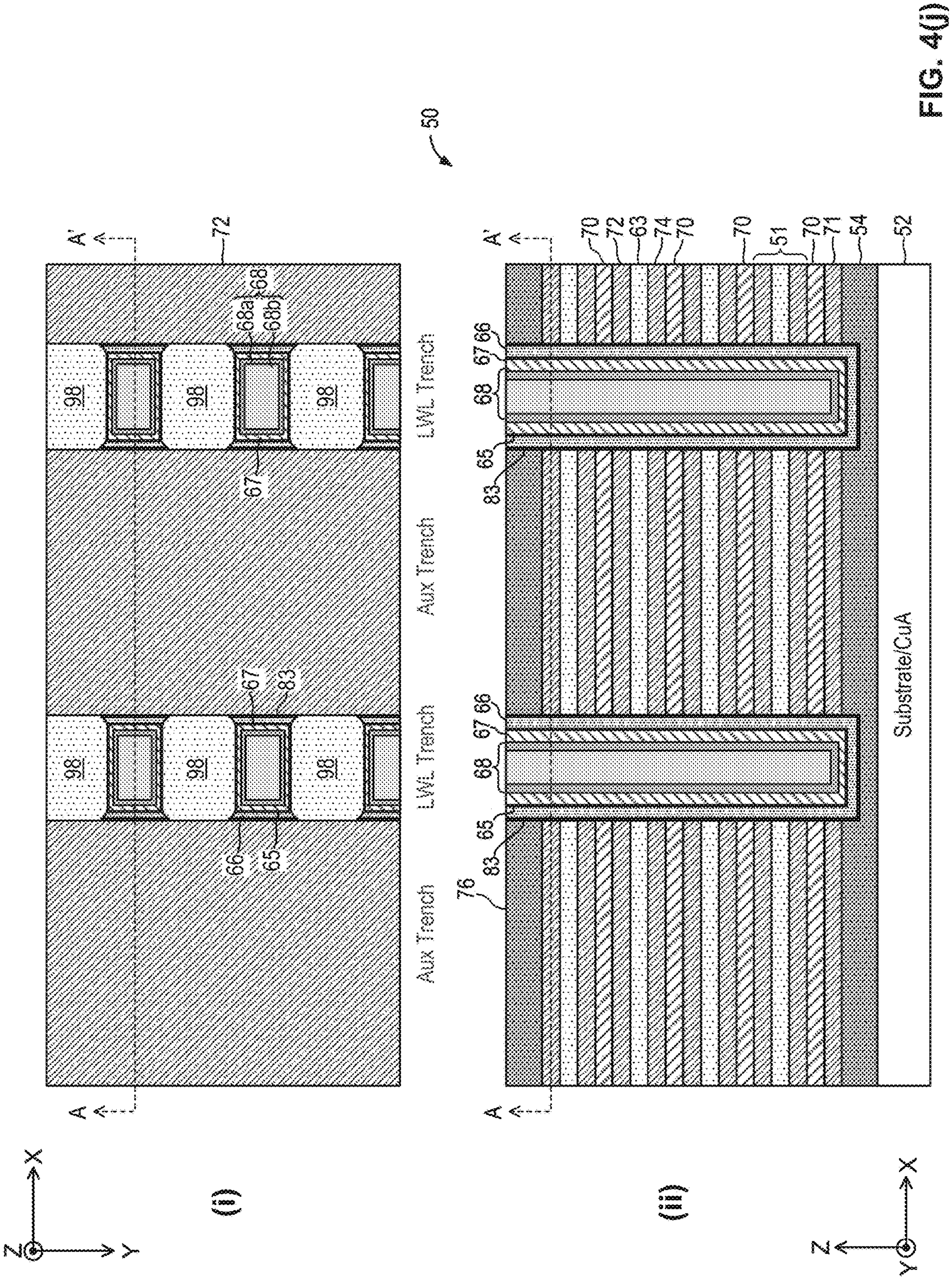
Figure 4K:
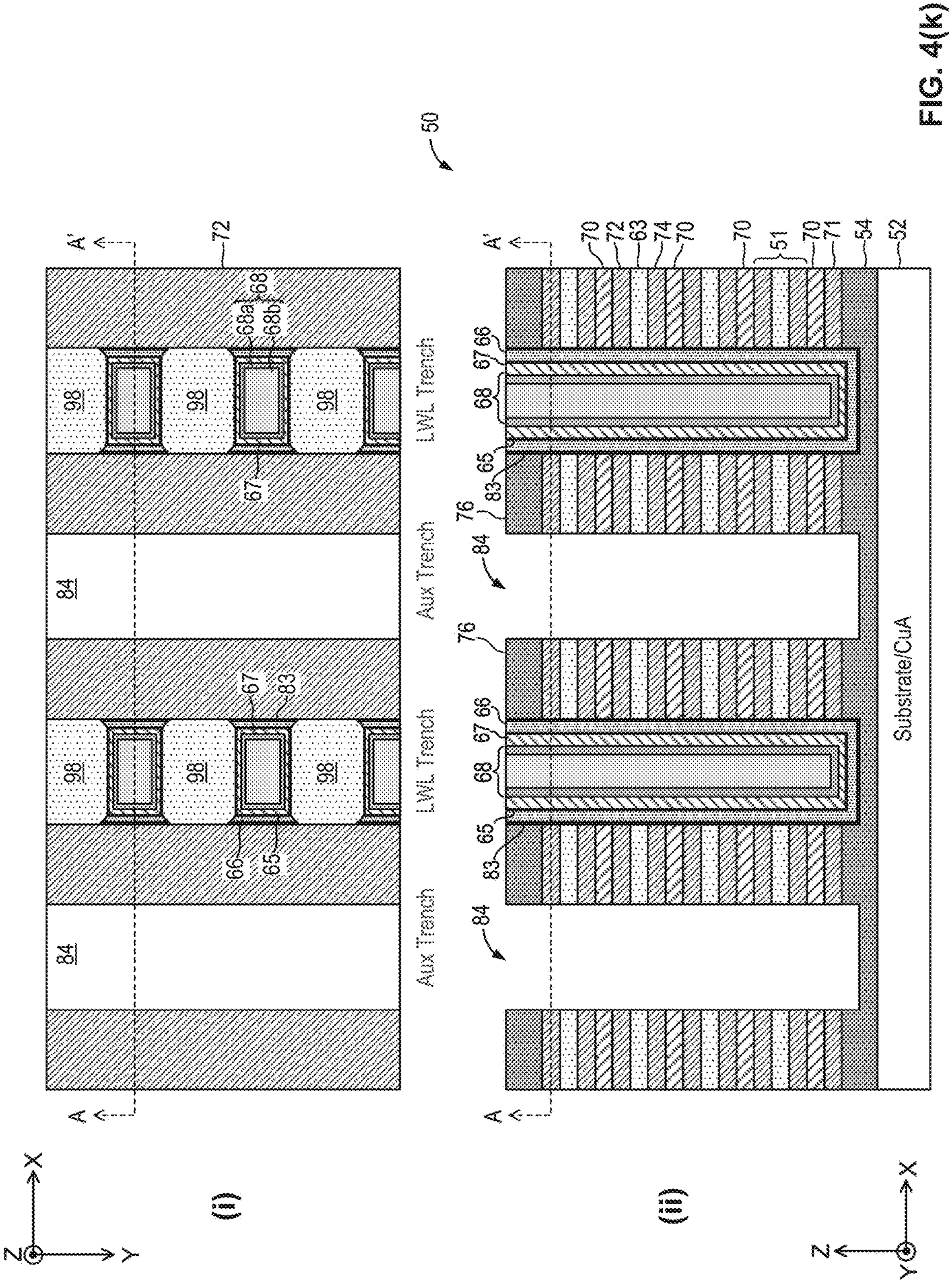
Figure 4I:
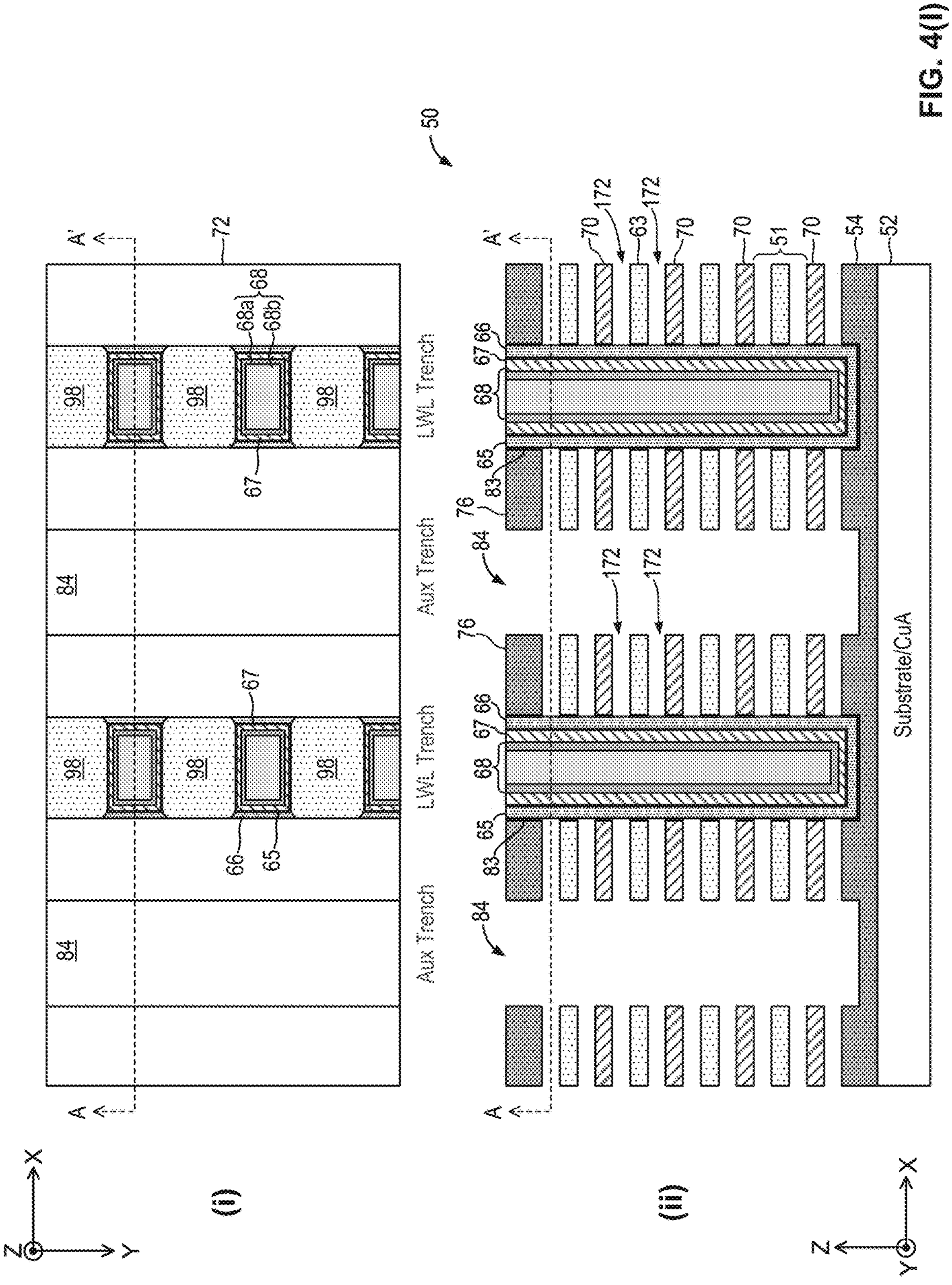
Figure 4M:
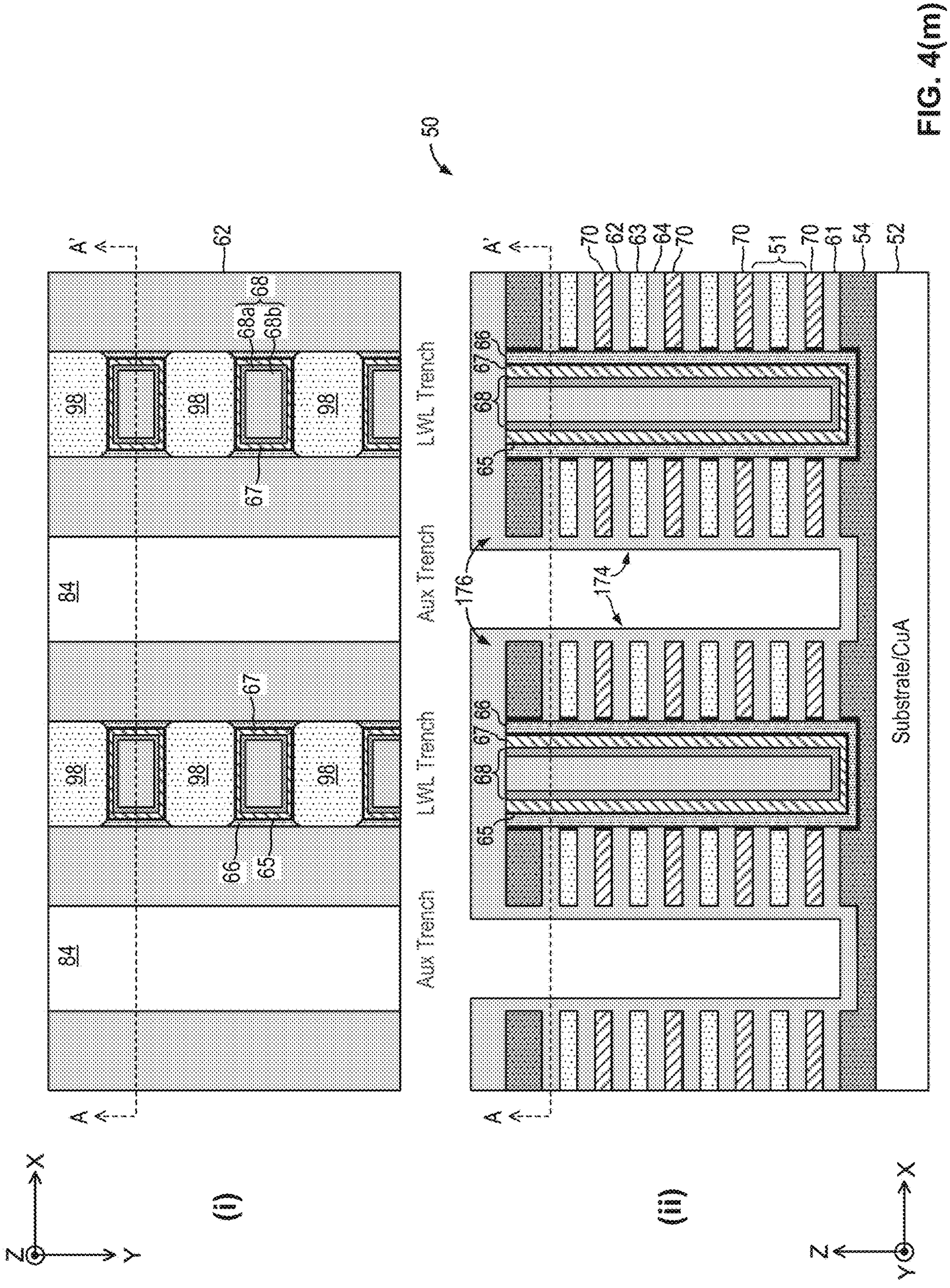
Figure 4N:
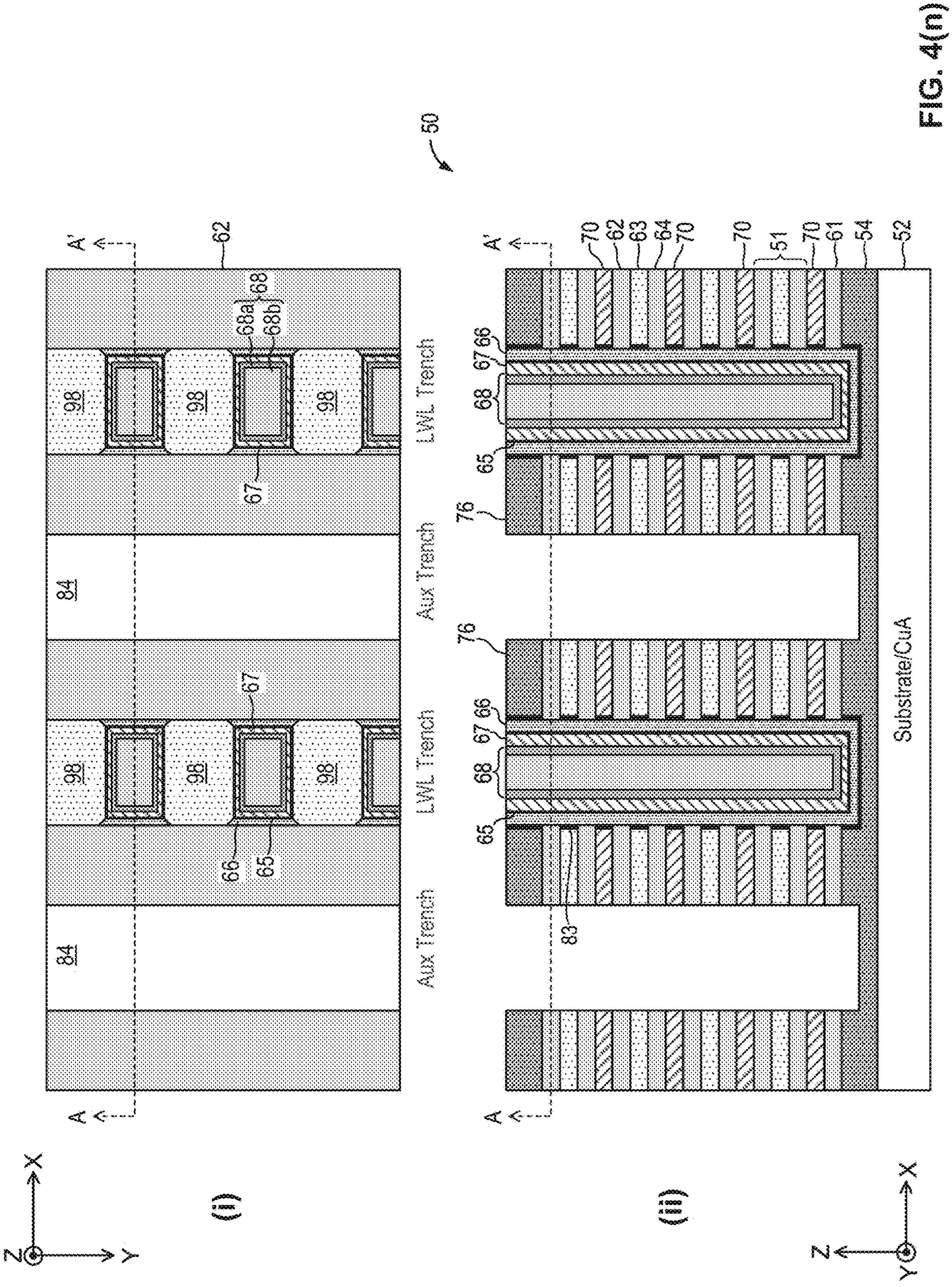
Figure 4O:
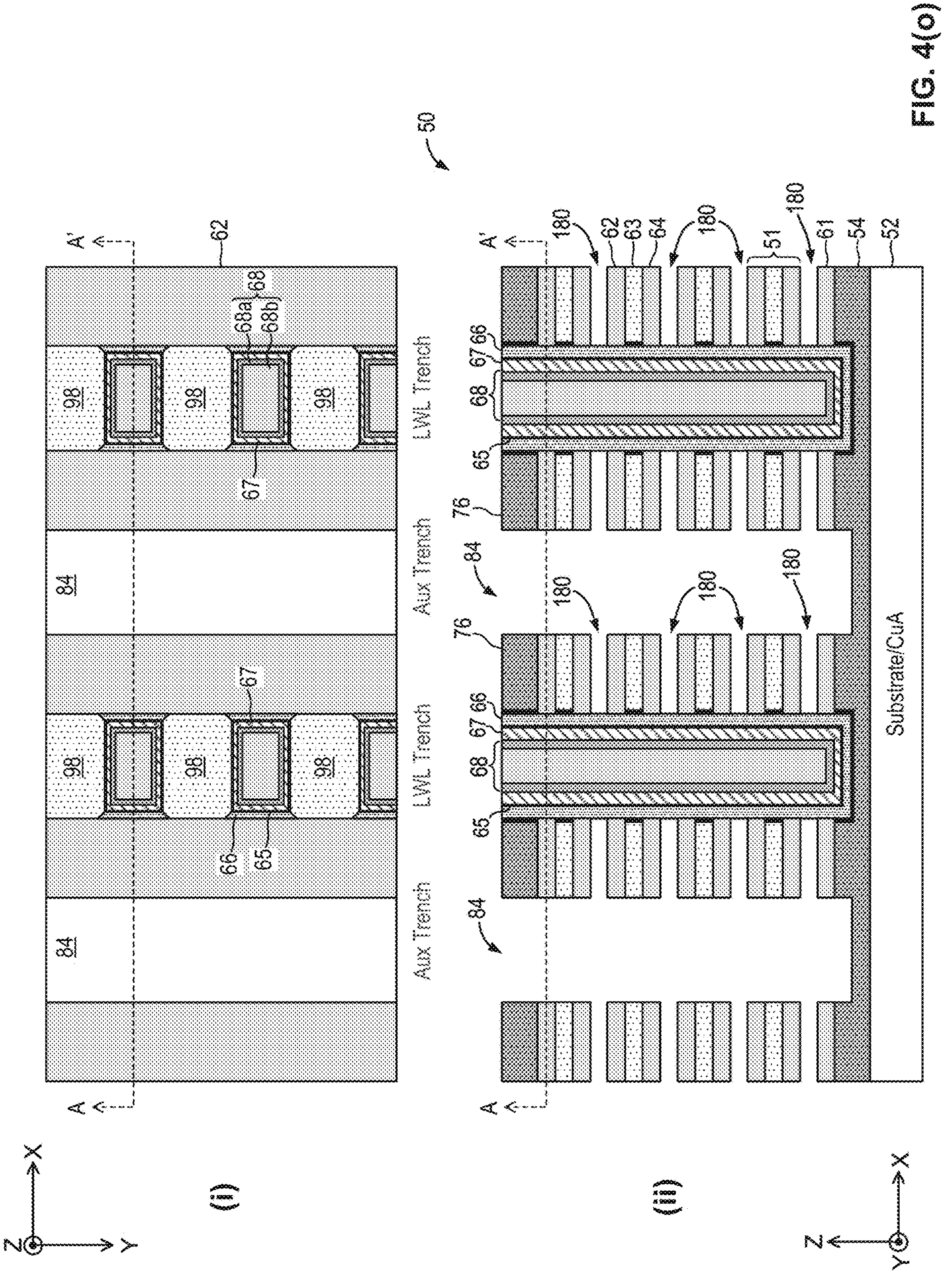
Figure 4P:
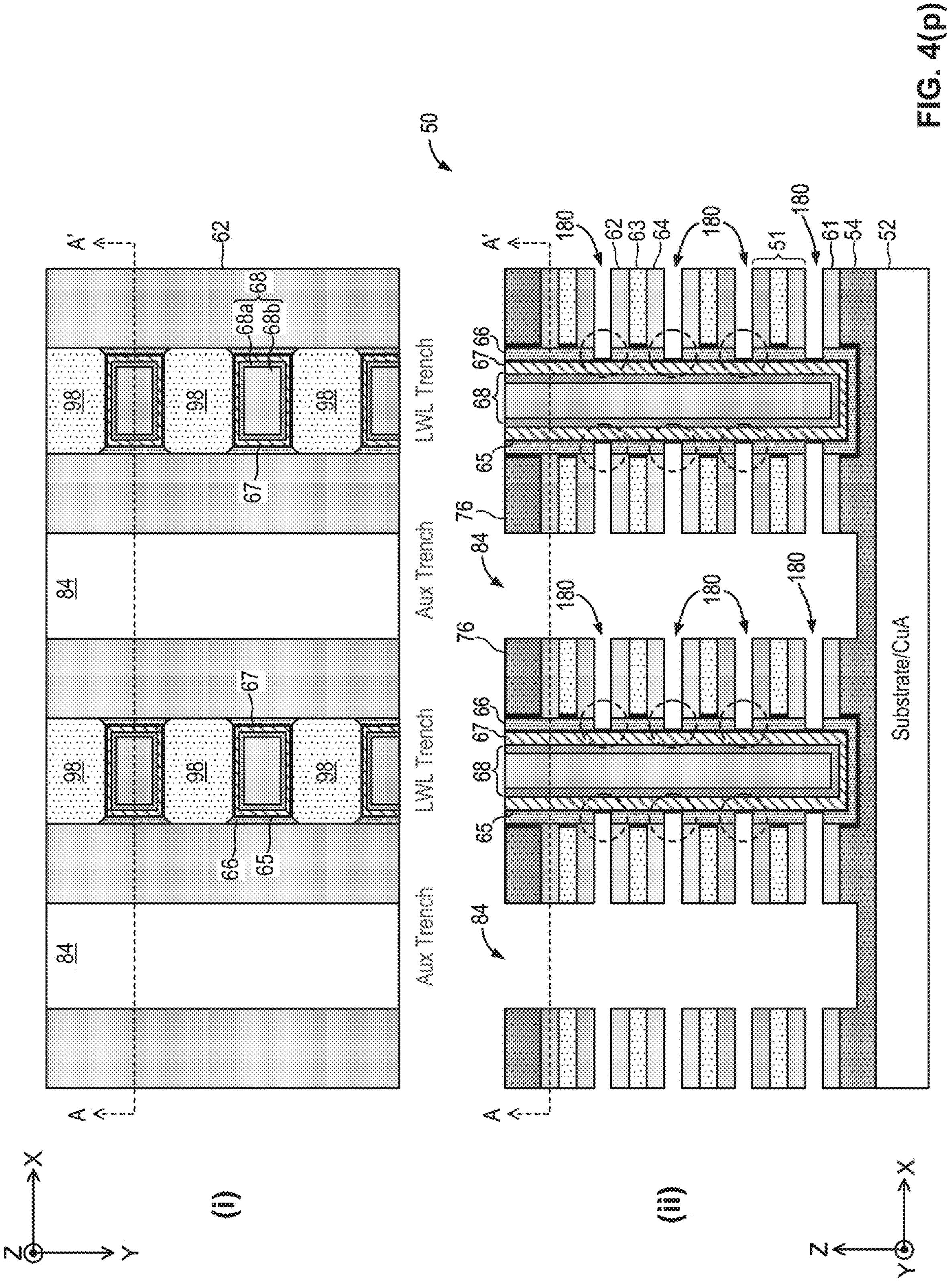
Figure 4:
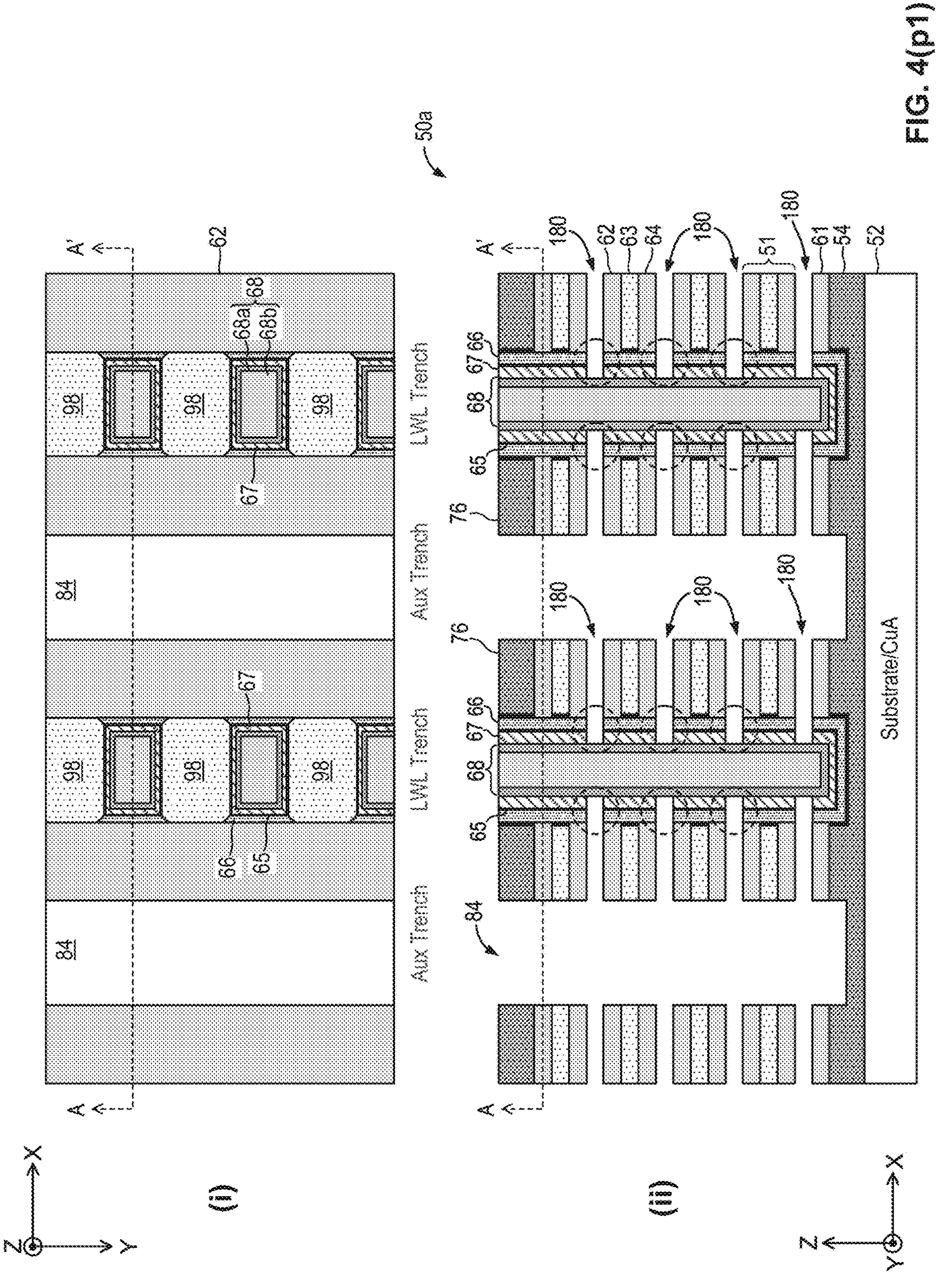
Figure 4Q:
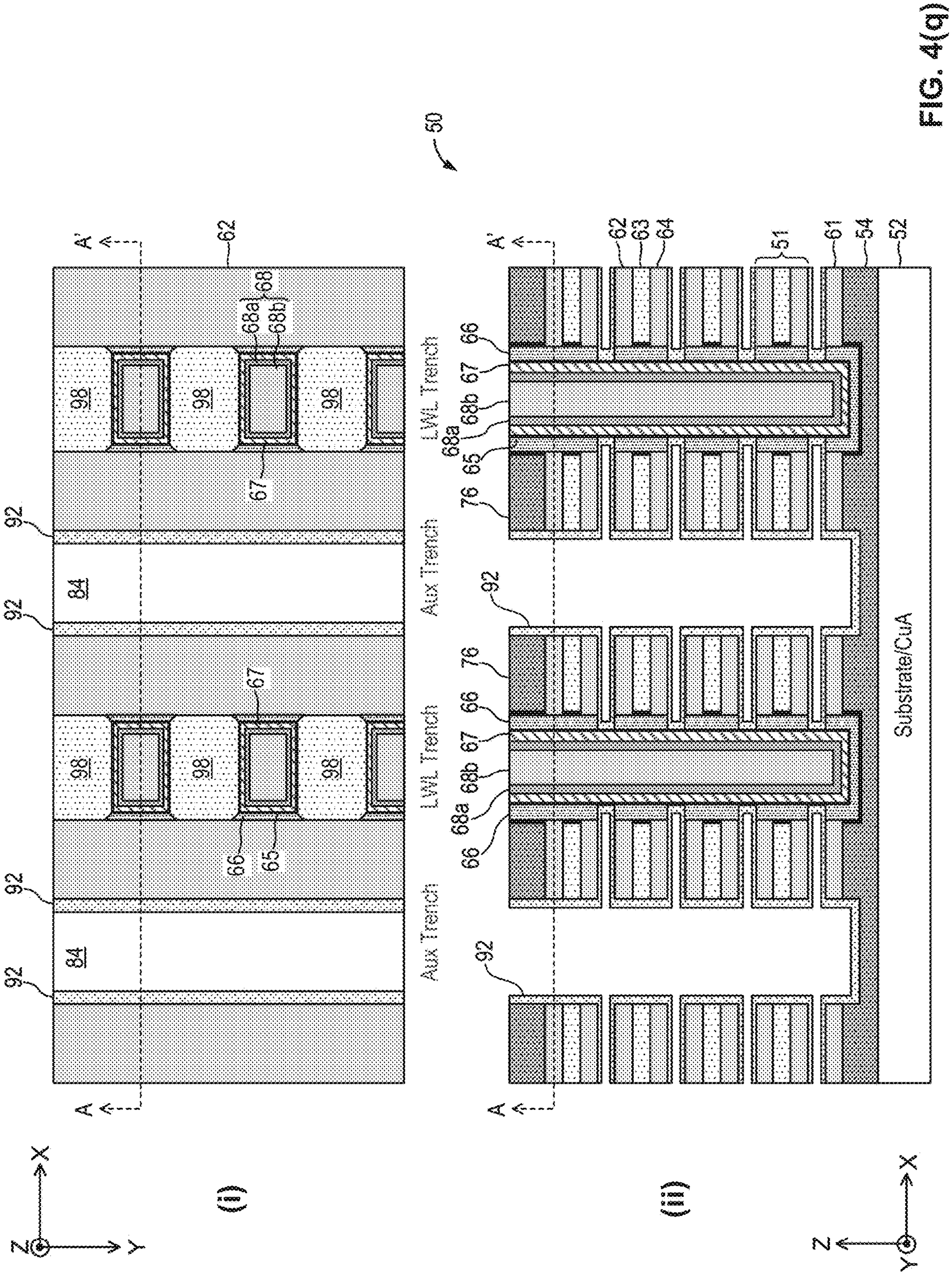
Figure 4R:
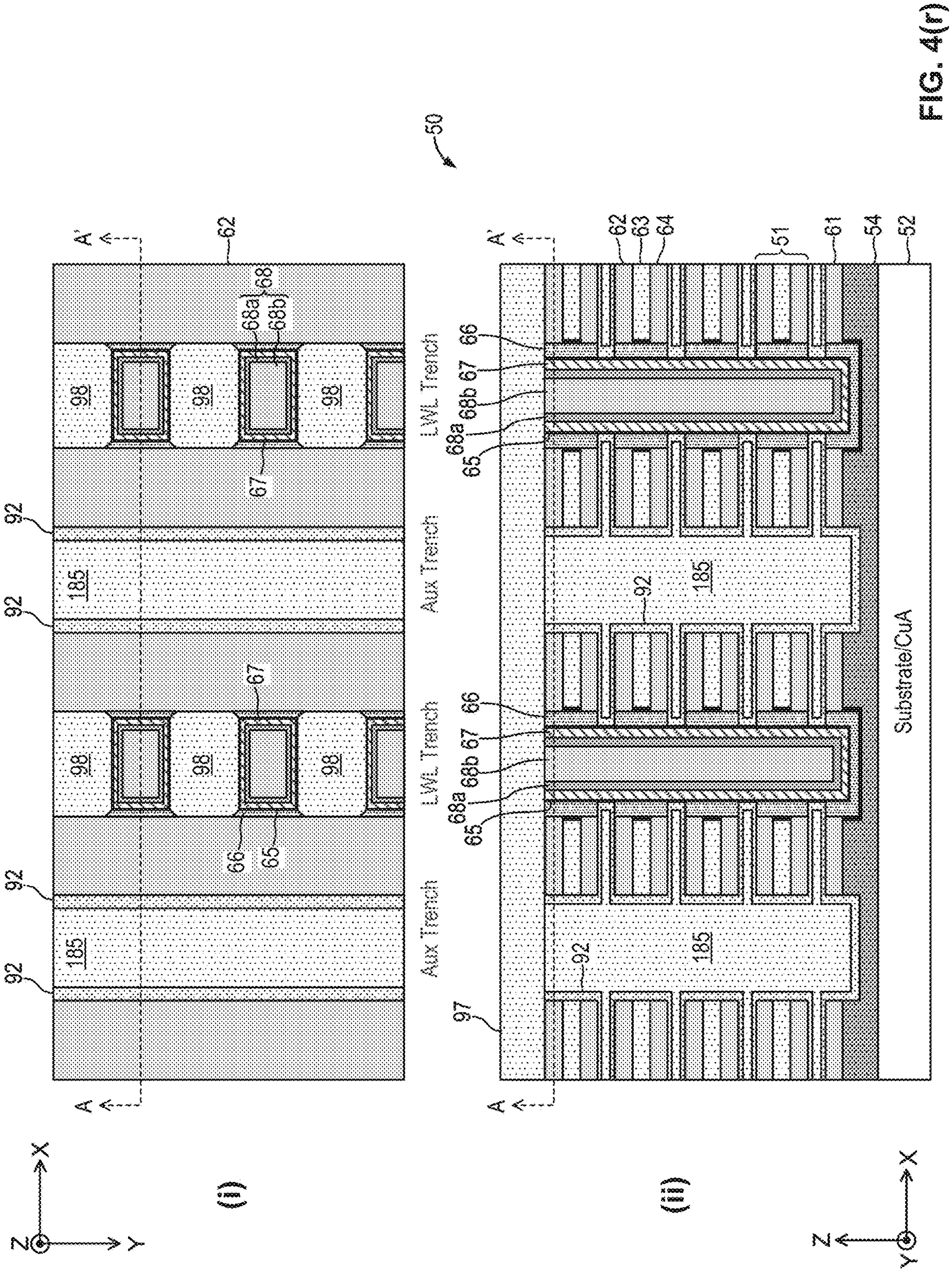
Figure 4S:
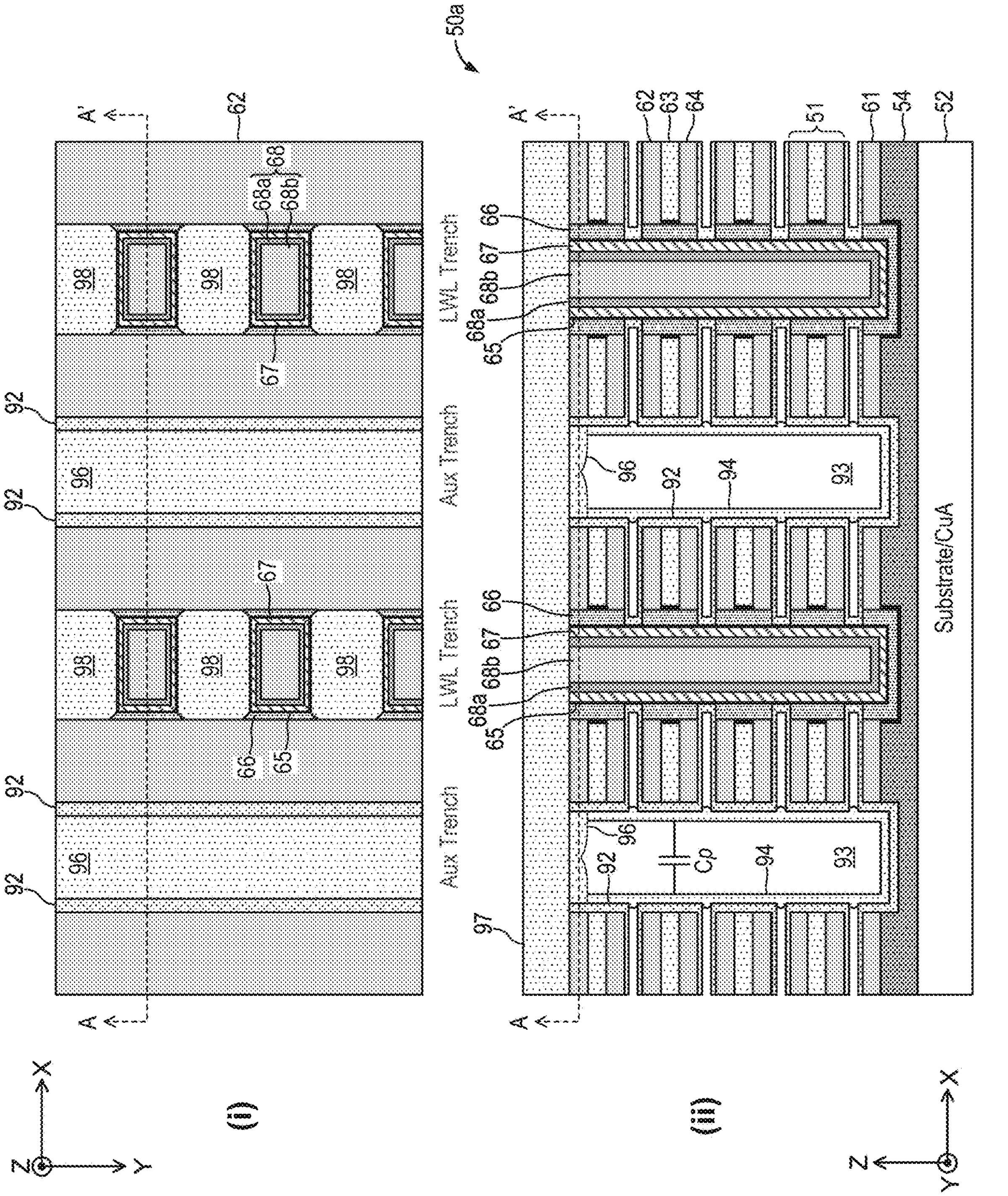
Figure 4T:
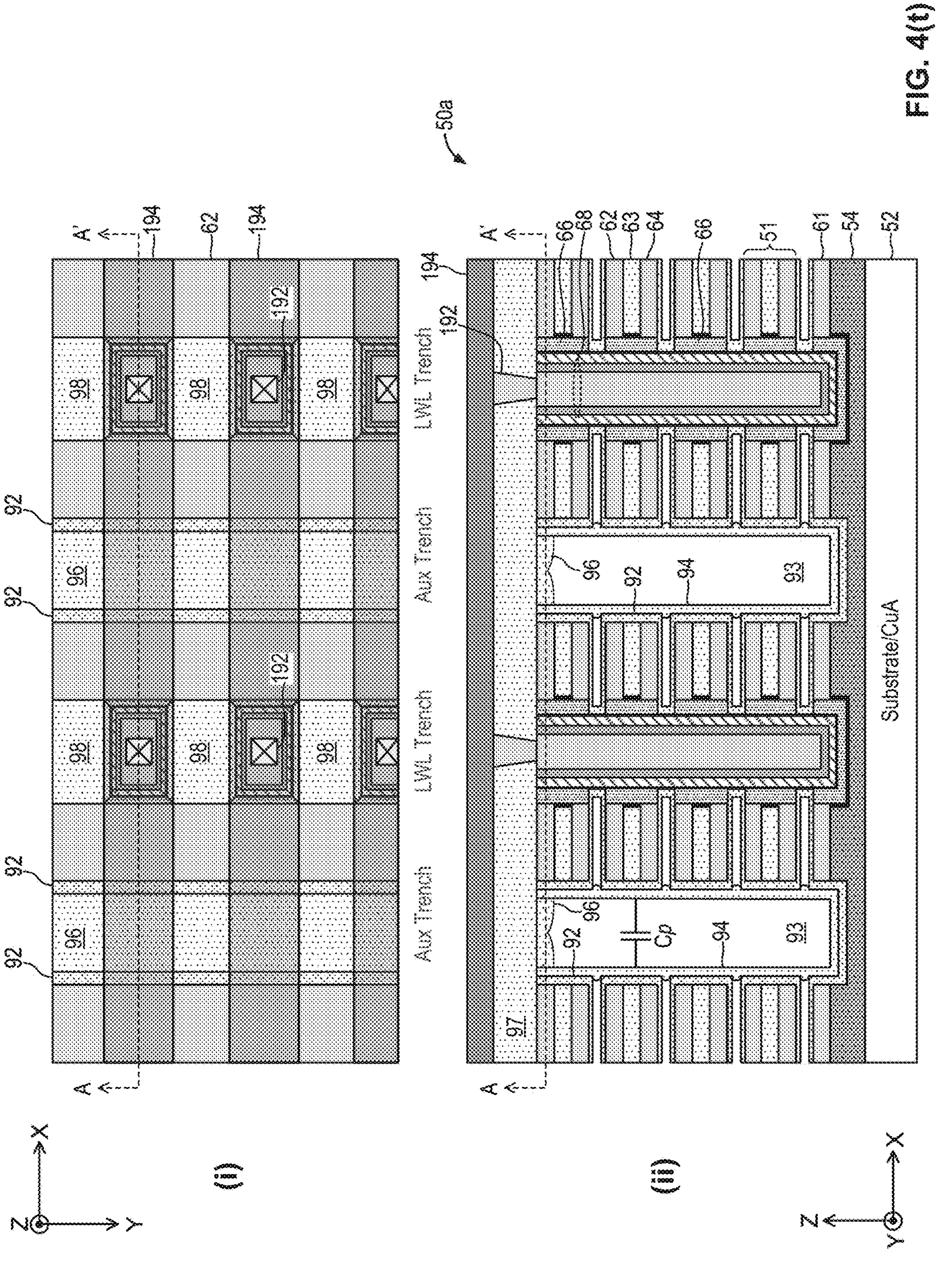

FIGS. 4(*a*) to 4(*t*), including FIG. 4(*p*1), illustrate a process for fabricating a memory structure including HNOR memory strings in embodiments of the present invention. Each figure in FIGS. 4(*a*) to 4(*s*) includes two views: view (i) is a horizontal cross-sectional view (i.e., in an X-Y plane) along line A-A' in view (ii), and view (ii) is a vertical cross-sectional view (i.e., in an X-Z plane) along line A-A' in view (i). The part of the fabrication process shown in FIGS. 4(*a*)-4(*s*) relating to the local word line formation process will be described with reference to FIG. 3.

Referring to FIG. 4(*a*), initially, a semiconductor substrate 52 is provided and any circuitry to be formed in the substrate 52, such as the CuA and the interconnect conductors, are fabricated in or on the substrate 52. An insulating layer 54 is provided on top of the semiconductor substrate 52 to cover and protect the circuitry formed on and in the semiconductor substrate 52. In some embodiments, the insulating layer 54 is a dielectric layer which may also serve as an etch stop layer for the subsequent processing steps. In some embodiments, the insulating layer 54 is a silicon oxycarbide (SiOC) layer or an aluminum oxide ($Al_2O_3$) layer. The insulating layer 54 can be formed using any material with suitable selectivity for the subsequent etch processes to be performed.

Subsequently, a memory structure 50 is formed by successive depositions of (i) a multilayer 51 and (ii) an inter-layer sacrificial layer 70 on the planar surface of the semiconductor substrate 52, or in particular on the insulating layer 54 formed on the substrate 52. In the present example, an inter-layer sacrificial layer 70 is deposited on the insulating layer 54 before the first multilayer 51 is deposited. The multilayer 51 includes three sublayers: (a) a first sacrificial layer 72, (b) a channel spacer dielectric layer 63, and (c) a second sacrificial layer 74, in this order in the Z-direction. FIG. 4(*a*) shows the memory structure 50 after the depositions of the initial layers of thin films. Multilayer 51 is also referred to in this detailed description as an "active layer." View (i) in FIG. 4(*a*) illustrates the horizontal cross-section along a line A-A' in the first sacrificial layer 72 in view (ii). View (ii) in FIG. 4(*a*) illustrates the vertical cross-section of the memory structure 50 along the line A-A' shown in view (i). The first and second sacrificial layers 72 and 74 are to be replaced by respective conductive layers in subsequent processing. The inter-layer sacrificial layer 70 (also referred herein as the third sacrificial layer) is to be replaced by an isolation material in subsequent processing to form an inter-layer isolation layer for providing separation between the active layers, as will be described in more details below. In one embodiment, each sublayer in the multilayer 51 and the inter-layer sacrificial layer 70 has a thickness of typically 30 nm or less. In another embodiment, the sublayers in the multilayer 51 and the inter-layer sacrificial layer 70 do not have the same thickness. In the present description, the dimensions are provided merely for illustrative purposes and are not intended to be limiting. In actual implementation, any suitable thicknesses or dimensions may be used for each of the sublayers and the sacrificial layers.

In some embodiments, the memory structure 50 may include additional optional topmost or bottommost layers provided as dummy sublayers. For example, additional topmost sublayers can be provided to function as a capping layer for the topmost sacrificial layer during the replacement process. In the present embodiment, the memory structure 50 includes a bottommost dummy sublayer 71 which is formed of the same sacrificial material as the first or second sacrificial layers 72, 74. The bottommost dummy sublayer 71 is formed on the semiconductor substrate 52, or in particular on the insulating layer 54 formed on the substrate 52 and before the first inter-layer sacrificial layer 70. The dummy sublayer 71 will be replaced by a conductive layer to function as an anchoring layer for the metal stacks to be formed, as will be described in more detail below. The dummy sublayer 71 is optional and may be omitted in other embodiments of the present invention.

In some embodiments, the first and second sacrificial layers 72 and 74 and the dummy sublayer 71 are each a silicon nitride layer. The channel spacer dielectric layer 63 is an insulating dielectric material, such as silicon dioxide ($SiO_2$). The inter-layer (or third) sacrificial layer 70 is a sacrificial material selected from carbon, amorphous silicon (aSi), or silicon germanium (SiGe).

After the memory structure is formed with the desired number of multilayers 51 with the third sacrificial layers 70 therebetween and the optional dummy sublayer 71, a capping layer 76 is formed on the top of the memory structure. The capping layer 76 is used as a masking layer in subsequent processing, such as for use as a self align mask for forming the local word line structures. In some embodiments, the capping layer 76 is a silicon oxide layer or a silicon oxycarbide (SiOC) layer. A mask 78 is applied on the memory structure (on the capping layer 76) to define trenches to be formed in the memory structure. In some embodiments, the mask 78 is an amorphous hard mask, such as an amorphous carbon hard mask. The mask 78 is patterned, for example, using a photo-lithographical patterning step, to define openings 79 where trenches are to be formed in the memory structure. It is instructive to note that the mask 78 is not drawn to scale in FIG. 4(*a*) and it is understood that an amorphous hard mask of sufficient thickness is provided in the high-aspect ratio etch process of the multilayer memory structure 50.

The fabrication process then proceeds to the local word line formation process to form local word line structures in the multilayer memory structure 50. In embodiments of the present invention, the local word line formation process 300 described in FIG. 3 is used and the following description refers to the flowchart in FIG. 3 as well as the cross-sectional drawings in FIGS. 4(*b*) to 4(*j*). In particular, the local word line formation process 300 uses a local word line damascene process to form the local word line structures. The local word line formation process 300 (FIG. 3) starts with forming local word line trenches (LWL trenches) in the multilayer memory structure 50 (302). Referring to FIG. 4(*b*), using the patterned mask 78, a first set of trenches 80 are formed in memory structure 50 using, for example, a selective anisotropic etch process with the mask 78 as the masking layer. After the trench etch process, remaining portions of the mask 78 is removed and the resulting structure is shown in FIG. 4(*b*). The first set of trenches 80 are arranged in the X-direction across the memory structure 50. The anisotropic etch process etches or remove all layers in the areas exposed by the mask 78, stopping at the insulation layer 54, which functions as an etch stop. In the present description, the first set of trenches 80 is referred to as operational trenches or active trenches or local word line trenches (LWL trenches or LWT), as the trenches will eventually accommodate the active ferroelectric storage transistors. In one example, each of the trenches 80 has a width of about 55 nm at the top of the trench and a pitch of 224 nm, with the trenches having a spacing of 169 nm apart. In other words, the operational trenches 80 are separated by a mesa of 169 nm. In subsequent processing, auxiliary trenches are to be formed in the mesa between each pair of operational trenches 80. The auxiliary trenches are to be formed equidistant between an adjacent pair of operational trenches 80. In one example, the auxiliary trenches may have a width of about 55 nm, resulting in a mesa between an operational trench and an auxiliary trench of about 57 nm, where the remaining mesa forms the active stack in the memory structure, as will be described in more details below.

The local word line formation process 300 then proceeds to form a liner, such as a dielectric liner layer, on the exposed trench sidewalls of the operational or LWL trenches 80 (304) and then the process 300 fills the LWL trenches 80 with a sacrificial filler material (306) (FIG. 3). Referring to FIG. 4(*c*), with the LWL trenches 80 thus formed, a dielectric liner layer 81 is deposited on the sidewalls of the trenches 80. For example, the dielectric liner layer 81 is deposited conformally on the sidewalls of the trenches 80. In one embodiment, the dielectric liner layer 81 is deposited by atomic layer deposition (ALD), chemical vapor deposition (CVD) or a combination thereof. In the present embodiment, the dielectric liner layer 81 is a silicon dioxide layer ($SiO_2$). In other embodiments, the dielectric liner layer 81 can be another dielectric material that has etch selectivity to the materials in the multilayer structure and to the channel layer to be subsequently formed. In one example, the dielectric liner layer 81 has a thickness of 1-5 nm in the X-direction. For example, the dielectric liner layer 81 may have a thickness of 2 nm in the X-direction in one embodiment.

The remaining volume in the trenches 80 is filled with a sacrificial filler material 82. In some embodiments, the local word line damascene process uses a sacrificial filler material 82 with desirable fill and etch properties. That is, the sacrificial filler material 82 is capable of filling high-aspect-ratio trench structures in a void-free manner and capable of being removed completely with minimal or no impact on the device characteristics of the storage transistors. For example, the sacrificial filler material can be removed at a processing temperature lower than 400° C. The sacrificial filler material 82 should have sufficient etch selectivity relative to the materials in the multilayer memory structure and to the channel layer material to be formed. In other aspects, the sacrificial filler material should also have desirable flow and leveling properties to ensure a planarized surface after filling the high-aspect-ratio trench structures. Furthermore, the local word line damascene process uses a sacrificial filler material 82 that has good thermal stability and is able to withstand high temperature processing steps after deposition, such as processing temperature greater than 500° C. In some embodiments, the sacrificial filler material 82 is a spin-on carbon (SOC) and in particular, in one embodiment, the sacrificial filler material 82 is a high-temperature-stable spin-on carbon (SOC). In other embodiments, the sacrificial filler material 82 may be selected from silicon germanium or silicon nitride.

In embodiments of the invention, the deposition of the SOC sacrificial filler material 82 includes excess material being formed on top of the memory structure 50. In some embodiments, the excess material is etched back, such as to the top of the hard mask layer 76, as shown in FIG. 4(*c*). Then, as shown in FIG. 4(*d*), an oxide capping layer 85 is formed on the top of the memory structure 50 to encapsulate the multilayer structure and the sacrificial filler material 82 in the filled trenches 80. In one embodiment, the SOC sacrificial filler material 82 is etched back using a dry etch process.

The local word line formation process 300 then proceeds to form shafts in the filled LWL trenches 80 (308) (FIG. 3). The shafts are excavated cavities in the LWL trenches in which the local word line structures are to be formed. In the present description, local word line structures, also referred to as the "gate electrode structures," refer to the columnar structures formed by the channel layer, the ferroelectric gate dielectric layer and the gate conductor layer. Referring to FIG. 4(*c*), the memory structure 50 is patterned to form shafts in the filled LWL trenches. A mask (not shown) is applied to the memory structure 50 with openings exposing areas for forming the deep shafts. In some embodiments, the mask can be a hard mask, such as an amorphous hard mask or an amorphous carbon hard mask. In the present embodiment, the mask is configured in a line and space pattern including opening to expose areas of the filled LWL trenches to be etched and lines to cover areas of the filled LWL trenches not to be etched. With the mask defining the openings, the exposed sacrificial filling material 82 is removed. In some embodiments, the exposed SOC filler material 82 may be removed by a selective anisotropic etch process, such as a plasma dry etch process. For example, the exposed SOC filler material 82 can be removed by an oxygen ($O_2$) plasma in a processing referred to as ashing. Subsequent to removing the exposed SOC filler material, the exposed dielectric liner layer 81 is removed, such as by using a controlled selective isotropic wet etch process or chemical dry etch process. As a result, shafts 88 are formed in the filled LWL trenches, as shown in FIG. 4(*c*).

It is instructive to note that the removal of the dielectric liner layer 81 from shafts 88 has the beneficial effect of removing any filler material residue that may have been left behind, ensuring the shafts 88 are free of filler material residue before the local word line structures are formed. In embodiments of the present invention, after the shafts 88 are formed, the fabrication process deposits a new dielectric liner 83 on the sidewalls of the shafts 88, as shown in FIG. 4(*e*1). For example, the dielectric liner layer 83 is deposited conformally on the sidewalls of the shafts 88. Forming the dielectric liner layer 83 has the beneficial effect of providing a uniform surface for the subsequent deposition of materials forming the local word line structure. In one embodiment, the dielectric liner layer 83 is deposited by atomic layer deposition (ALD), chemical vapor deposition (CVD) or a combination thereof. In the present embodiment, the dielectric liner layer 83 is a silicon oxide layer ($SiO_2$). In other embodiments, the dielectric liner layer 83 can be another dielectric material that has etch selectivity to the materials in the multilayer structure and to the channel layer to be subsequently formed. In one example, the dielectric liner layer 83 has a thickness of 2-5 nm in the X-direction. For example, the dielectric liner layer 83 may be an ALD silicon dioxide layer having a thickness of 2 nm in the X-direction in one embodiment. In the following description, the dielectric liner layer 83 is illustrated by a thick black line around the sidewalls of shafts 88. The dielectric liner layer 83 is an optional sacrificial layer in the fabrication process of the memory structure and may be omitted in other embodiments of the present invention.

The local word line formation process 300 then proceeds to form local word line structures in the shafts (310) (FIG. 3). Referring to FIG. 4(*f*), using a damascene or additive process, the materials forming the local word line structures are deposited into the shafts 88 in successive deposition process. First, a channel layer 66 is deposited on the sidewalls of the shafts 88. In the present embodiment, the channel layer 66 is deposited on the dielectric liner layer 83 which functions to provide a uniform surface for the deposition of the channel layer 66. In some embodiments, the channel layer 66 is deposited by atomic layer deposition (ALD), chemical vapor deposition (CVD) or a combination thereof. In the present embodiment, the channel layer 66 is an oxide semiconductor layer, such as indium gallium zinc oxide (IGZO), indium zinc oxide (IZO), indium tungsten oxide (IWO), or indium tin oxide (ITO). In other examples, the channel layer 66 can be formed using other oxide semiconductor material compatible with IGZO. Furthermore, in some embodiments, the channel layer 66 may have a thickness in the X-direction of 1.5 nm to 12 nm. In one example, the channel layer 66 has a thickness of 5 nm in the X-direction.

The fabrication process continues with forming the gate dielectric layer of the storage transistors. Still referring to FIG. 4(*f*), a gate dielectric layer 67 is deposited into shafts 88 adjacent the channel layer 66. For example, the gate dielectric layer 67 may be deposited using atomic layer deposition. Then, a gate conductor layer 68 is deposited into the remaining volume of the shafts 88. After the deposition steps, excess material may be removed from the top of memory structure 50 using, for example, chemical-mechanical polishing (CMP). The resulting memory structure 50 is shown in FIG. 4(*f*). In each shaft 88, the conductive layer 68 provides a vertical local word line (LWL) that serves as gate electrode for each of the storage transistors that are vertically aligned in the same active stack.

In some embodiments, an interfacial layer 65 may be provided between the oxide semiconductor channel layer 66 and the gate dielectric layer 67. In some embodiments, the interfacial layer 65 is formed using a material with a high dielectric constant (K) ("high-K" material). In some embodiments, the interfacial layer 65 may be a silicon nitride ($Si_3N_4$) layer, or a silicon oxynitride layer, or an aluminum oxide ($Al_2O_3$) layer and may have a thickness of 1-2 nm. Other materials for the interfacial layer 65 may be indium tungsten oxide. In some embodiments, the interfacial layer 65 may be deposited using an atomic layer deposition (ALD) technique and furthermore, in some embodiments, the interfacial layer 65 may be deposited in the same process chamber as the gate dielectric layer, without breaking vacuum between the deposition of the two layers. In one embodiment, the interfacial layer 65 is an aluminum oxide ($Al_2O_3$) layer and is annealed to yield an amorphous film with the desired characteristics. In some embodiments, the aluminum oxide ($Al_2O_3$) layer can be annealed in oxygen ($O_2$), ozone ($O_3$), nitrous oxide ($N_2O$), forming gas ($H_2N_2$), or argon (Ar). The interfacial layer 65 is optional and may be omitted in other embodiments of the present invention.

In the present embodiment, the memory structure 50 is used to form ferroelectric storage transistors and the gate dielectric layer 67 is a ferroelectric material forming a ferroelectric polarization layer. The ferroelectric polarization layer can be deposited using an atomic layer deposition (ALD) technique and may have a thickness between 2 nm to 8 nm in one example or 1 nm to 14 nm in another example. A thermal anneal is performed to form the ferroelectric phase in the deposited ferroelectric material. In most cases, the ferroelectric material is annealed in the presence of a capping layer, typically a conductive layer. The anneal operation may be performed during any of the subsequent processing steps after the deposition of the conductive capping layer onto the deposited ferroelectric gate dielectric layer. In some cases, a sacrificial conductive capping layer is applied for use during the anneal process and is removed after the anneal process. The gate conductor layer is then deposited onto the annealed ferroelectric gate dielectric layer.

In one embodiment, the ferroelectric polarization layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric polarization layer is a material selected from: zirconium-doped hafnium oxide (HZO), silicon-doped hafnium oxide (HSO), aluminum zirconium-doped hafnium oxide (HfZrAlO), aluminum-doped hafnium oxide ($HfO_2$:Al), lanthanum-doped hafnium oxide ($HfO_2$:La), hafnium zirconium oxynitride (HfZrON), hafnium zirconium aluminum oxide (HfZrAlO), and any hafnium oxide that includes zirconium impurities.

In the present embodiment, the gate conductor layer 68 is a metal layer and can include a thin conductive liner 68*a* and a conductive filler material 68*b*. The thin conductive liner 68*a* may be a titanium nitride (TiN) liner or a tungsten nitride (WN) liner and may have a thickness of 3-5 nm. The conductive filler material 68*b* may be a metal, such as tungsten (W) layer or molybdenum (Mo), or heavily doped n-type or p-type polysilicon. In some embodiments, the gate conductor layer 68 may be a conductive layer without a conductive liner.

As thus formed, the memory structure 50 includes LWL structures formed spaced apart in the LWL trenches and sacrificial filler materials remaining in the areas of the LWL trenches between the LWL structures. In the present description, the areas between the LWL structures are referred to as LWL isolation areas. The local word line formation process 300 then proceeds to remove the sacrificial filler material remaining in the LWL isolation areas between LWL structures formed in the LWL trenches (312) (FIG. 3). Referring again to FIG. 4(*f*), after the LWL structures are formed and the excess deposited materials are removed by CMP from the top of the memory structure 50, the memory structure 50 includes LWL structures formed in the LWL trenches and the sacrificial filler material 82 in the LWL isolation areas. An etch process can then be performed on the memory structure to remove the sacrificial filler material 82. For example, in the case the sacrificial filler material 82 is SOC, the memory structure 50 can be subjected to a wet etch process or a dry etch process, such as an oxygen plasma, to remove the sacrificial filler material 82 selectively. The SOC etch process can be performed without masking as the etch selectivity for SOC to the other materials in the memory structure is high. FIG. 4(*g*) illustrates the resulting structure after removal of the sacrificial filler material 82 from the memory structure 50. Excavated cavities 89 are formed in the LWL isolation areas.

The local word line formation process 300 then proceeds to remove the exposed liner from the excavated cavities (314) (FIG. 3). Referring still to FIG. 4(*g*), after removal of the sacrificial filler material, the dielectric liner layer 81 remains in the LWL isolation areas and is exposed. Furthermore, portions of the dielectric liner layer 83 facing the LWL isolation areas are also exposed. The fabrication process removes the dielectric liner layer 81, such as by a wet etch or a dry etch process. For example, when the dielectric liner layer 81 is a silicon dioxide layer ($SiO_2$), the dielectric liner layer 81 may be removed by a wet etch process, such as by using diluted hydrofluoric acid (DHF), or by a dry etch process, such as plasma etching. In the case the dielectric liner layer 83 is formed of the same material as dielectric liner layer 81, the portions of the dielectric liner layer 83 exposed in excavated cavities 89 are also removed. FIG. 4(*h*) illustrates the resulting structure after removal of the dielectric liner 81 and portions of the dielectric liner layer 83 from the memory structure 50. The excavated cavities 89 forming the LWL isolation areas are now cleared of the sacrificial filler material, the dielectric liner layers 81 and 83.

As thus formed, portions of the channel layer 66 are exposed by the excavated cavities 89. In embodiments of the present invention, the local word line formation process 300 then proceeds to remove the exposed channel layer on the sidewalls of the LWL structures facing the LWL isolation areas (316) (FIG. 3). In the present description, the channel layer removal process is referred to as horizontal channel separation. The local word line formation process, using a damascene process to form the LWL structures, enable effective horizontal channel separation to realize better control of the channel isolation between storage transistors formed on separate common bit lines. Referring to FIG. 4(*i*), the exposed oxide semiconductor channel layer 66 on the sidewalls of the excavated cavities 89 is removed, such as by selective anisotropic dry etch or by atomic layer etch (ALE), or by controlled selective wet etch process. For example, the channel layer 66 may be an IGZO layer and the etchant can be a diluted hydrochloric acid (HCl). As a result, portions of the channel layer 66 formed on the sidewalls of the LWL isolation areas between adjacent LWL structures are removed, as shown by the dotted circles in FIG. 4(*i*). The removal of these portions of the channel layer 66 provides isolation of the channel layer of the storage transistors which will be formed on either side of each LWL structure. It is instructive to note that the etch rate of the channel layer 66 is usually faster along the center portion of the sidewall and slower at the corners. Therefore, the removal of the channel layer can leave behind rounded portions at the corner of the LWL structures.

In alternate embodiments, the exposed channel material 66 may be only partially etched in a controlled etch to not etch all the way through the full thickness of the channel layer 66, leaving a much thinner remaining channel material along the exposed sidewalls in the excavated cavities 89 (not shown), thereby to substantially reduce its effectiveness as a parasitic channel conductor between storage transistors formed on two sides of the LWL structures. By removing, wholly or partially, the channel material in the excavated cavities 89, physical and electrical separation of the storage transistors to be formed on separate memory strings in the X-direction is realized.

In one embodiment, subsequent to the removal of the channel layer portions, the local word line formation process 300 proceeds to fill the LWL isolation areas (i.e. the excavated cavities 89) between the LWL structures with a dielectric material (318*a*) (FIG. 3). Referring to FIG. 4(*j*), the excavated cavities 89 are filled with a dielectric material, forming dielectric filled shafts 98. For example, the dielectric material can be an oxide material, such as silicon dioxide ($SiO_2$). The dielectric filled shafts 98 serve as dielectric separation between adjacent local word line structures. In alternate embodiments, the excavated cavities 89 can be left unfilled to use as air gap isolation structures, as will be explained in more detail below.

With the local word line structures and the dielectric filled shafts 98 thus formed, the local word line formation process is completed and the memory structure 50 proceeds to complete the remaining process to form the three-dimensional NOR memory strings of storage transistors. Referring to FIG. 4(*k*), a mask (not shown) is applied which covers the LWL trenches and protects the local word line structures formed therein while exposing openings where the auxiliary trenches are to be formed. In some embodiments, the mask is an amorphous hard mask, such as an amorphous carbon hard mask. With the mechanical support from the dielectric filled shafts 98 and the local word line structures therebetween, a second set of trenches 84 are formed using substantially the same technique as discussed in conjunction with FIGS. 4(*a*) and 4(*b*) above. For example, the memory structure is selectively anisotropically etched using a patterned hard mask layer defining the openings for the second set of trenches. The anisotropic etch process etches or removes all layers in the areas exposed by the patterned hard mask, stopping at the etch stop layer 54. After the trench etch process, remaining portions of the mask is removed and the resulting memory structure 50 is shown in FIG. 4(*k*). The second set of trenches 84 is referred to as the auxiliary trenches. In some examples, the auxiliary trenches 84 may be 55 nm wide. Each of the second set of trenches 84 is cut between an adjacent pair of the local word line trenches (LWT) and each of the second set of trenches 84 is cut substantially equidistant between an adjacent pair of the local word line trenches (trenches 80). As a result of trenches 80 and 84 being cut in the multilayer memory structure, memory stacks are formed by the mesas of the multilayer memory structure which are referred to as "active stacks" in the present description. In some examples, the active stacks are each approximately 57 nm wide, which is the width of the bit-lines. The narrow bit line strips resulting from the cutting of the active layers 51 are referred herein as "active strips."

In embodiments of the present invention, the fabrication process forms the local word line trenches (LWT) to house the local word line structures for forming storage transistors with the active stacks bordering the LWTs. Meanwhile, the fabrication process forms the auxiliary trenches to facilitate metal replacement and channel separation processes. The auxiliary trenches do not include local word line structures and do not form storage transistors with the bordering active stacks. With the auxiliary trenches 84 thus formed, the fabrication process performs metal replacement where the first and second sacrificial layers 72 and 74 are removed and replaced with the respective first and second conductive layers.

Referring to FIG. 4(*l*), the first and second sacrificial layers 72 and 74 are removed using, for example, a selective dry etch or a selective wet etch process, thereby creating cavities between the channel spacer dielectric layer 63 and the inter-layer sacrificial layer 70. Portions of the dielectric liner layer 83 exposed by the cavities after removal of the first and second sacrificial layers 72, 74 are also removed. The removal of the first and second sacrificial layers 72, 74 and the associated portions of the dielectric liner layer 83 exposes the backside of the channel layer 66. In one example, the first and second sacrificial layers 72 and 74 are silicon nitride layers which are removed using a selective wet etch process using hot phosphoric acid. The dielectric liner layer 83 is an oxide layer may be removed using a selective dry etch process, such as an atomic layer etch process, or a selective wet etch process. The remaining layers 63 and 70 are typically 30 nm or less in thickness and 30 nm to 60 nm long; they are held in place by being attached to the channel layer 66 (through the dielectric liner layer 83) and the dielectric filled shafts 98. All of these layers are supported by the rigid metallic vertical local word line 68, which is repeated every local word line pitch (as shown in FIG. 4(*l*)(*i*)) along the entire length of each memory string. The feature of having strong mechanical support by metallic local word lines spanning the entire depth of very tall and narrow memory stacks results in physical stability of the stacks, thereby enabling scaling up the height of the memory stacks even in case of very high aspect ratio memory structures.

With the sacrificial layers 72 and 74 removed and associated portions of the dielectric liner layer 83 also removed, a conductive layer is deposited on the memory structure 50. Prior to the deposition process, the exposed backside of the channel layer 66 can be cleaned of any surface oxidation without damaging the channel layer. In some embodiments, the conductive layer is deposited using chemical vapor deposition or atomic layer deposition. The conductive layer fills the cavities in the multilayer memory structure and is also formed on the sidewalls 174 of the auxiliary trenches 84 and also on the top surfaces 176 of the multilayer memory structure, as shown in FIG. 4(*m*). The excess material formed on the sidewalls and on the top surface of the multilayer structure is removed by a dry selective etch, and in some cases, followed by a selective wet etch process to remove remaining metal residues or stringers. The resulting structure is shown in FIG. 4(*n*).

Referring to FIG. 4(*n*), as a result of the metal replacement process, a first conductive layer 62 and a second conductive layer 64 are formed. The first and second conductive layers are in contact with the channel layer 66 and are spaced apart by the channel spacer dielectric layer 63. In each active layer 51, the first conductive layer 62 forms the common drain (bit) line and the second conductive layer 64 forms the common source line of the NOR memory string to be formed. In some embodiments, the first and second conductive layers 62, 64 are each a metal layer and may be a tungsten (W) layer with a titanium nitride (TiN) liner, a tungsten nitride (WN) liner and a tungsten (W) layer, a molybdenum layer or a cobalt layer, or other conductive materials described above.

Furthermore, it is instructive to note that the dummy sublayer 71 is also replaced in the metal replacement process to form a dummy conductive layer 61. The dummy conductive layer 61 is the bottommost layer of each memory stack which functions to provide anchoring support of each memory stack to the semiconductor substrate 52, improving the structural integrity of each memory stack. As described above, the dummy conductive layer 61 is optional and may be omitted in other embodiments of the present invention.

Following the metal replacement process, the auxiliary trenches 84 will now be used for separating the channel layer 66 between each active layer 51, in a process referred to as vertical channel separation. Referring to FIG. 4(*o*), using the auxiliary trenches 84 which exposes the inter-layer sacrificial layer 70 from the sides of the active stack, the fabrication process removes the third sacrificial layer 70, leaving cavities 180 in places where the third sacrificial layer 70 used to be. Various removal processes can be used depending on the material used for the third sacrificial layer 70. For example, in the case the sacrificial layer 70 is a carbon layer, the carbon layer can be removed by ashing in an oxygen ambient. In the case the sacrificial layer 70 is amorphous silicon or silicon germanium, a selective wet or dry etch process can be used. Portions of the dielectric liner layer 83 exposed by the cavities 180 after removal of the sacrificial layer 70 are also removed. The resulting memory structure 50 is shown in FIG. 4(*o*).

As shown in FIG. 4(*o*), the cavities 180 thus formed expose the channel layer 66 between the multilayers 51 in the active stacks. The auxiliary trenches 84 and the cavities 180 are used to remove the exposed portions of the channel layer 66 that straddle two adjacent multilayers 51 in the active stack (in the Z-direction). Referring to FIG. 4(*p*), the fabrication process uses the auxiliary trenches 84 and cavities 180 to deliver high etch selectivity etchant to the backside of the channel layer 66 to selectively etch the exposed portions of the channel layer 66, as indicated by the dotted circles in FIG. 4(*p*). As a result, the channel layer 66 is separated in the vertical direction (Z-direction) to each multilayer 51. In some embodiments, the channel layer 66 is an oxide semiconductor material, such as IGZO, and the fabrication process uses, for example, sulfuric acid, citric acid, acetic acid, hydrochloric acid, or ammonium hydroxide ($NH_4OH$) in a wet etch process to selectively etch the exposed portions of the channel layer 66. In some embodiments, the memory structure 50 includes the interfacial layer 65 and the backside etch of the channel layer 66 is selective to the interfacial layer 65 so that the interfacial layer acts as an etch stop for the backside etch process. That is, the exposed portion of the channel layer 66 is etched through the auxiliary trenches 84 and cavities 180 and the etch process will stop when the interfacial layer 65 is reached. In one embodiment, the interfacial layer 65 is an aluminum oxide ($Al_2O_3$) layer. In another embodiment, the backside etch process may be implemented as a multi-step etch process, including an atomic layer etch step used in the removal of the last 1-2 nm of the channel layer, in which the atomic layer etch step stops on the interfacial layer 65 or stop on the ferroelectric polarization layer 67.

In alternate embodiments, the exposed portions of the channel layer 66 between two adjacent multilayers 51 in the active stack (in the Z-direction) can be partially removed, leaving a thin portion that does not function effectively as a parasitic channel conductor.

In the embodiment shown in FIG. 4(*p*), the vertical channel separation process stops when the exposed portions of the channel layer 66 are removed and the channel region is physically separated (wholly or partially) and isolated to each active layer 51 in each active stack. In some embodiments, the channel separation process can continue, by a change of etchant chemistry or process, to remove the now exposed portions of the ferroelectric polarization layer 67, as shown in FIG. 4(*p*1). The separation of the ferroelectric polarization layer 67 is optional and may be omitted in other embodiments of the present invention. In some cases, care can be taken to minimize excessive undercutting by sideway etching of the channel layer 66 or the ferroelectric dielectric layer 67.

Referring to FIG. 4(*q*), after the vertical channel separation process, the exposed surfaces of the memory structure 50 may be passivated, such as by forming a thin liner layer 92. The liner layer 92 is a thin dielectric layer, such as around 1-2 nm thick. The liner layer 92 can be a silicon oxide layer, a silicon nitride layer or an aluminum oxide layer and serves to passivate or seal the exposed surfaces in the cavities 180 and the auxiliary trenches 84. In the present description, the thin liner layer 92 is also referred to as an air gap liner layer. In some embodiments, the liner layer 92 is formed of the same material as the interfacial layer 65. In one embodiment, the interfacial layer 65 and the liner layer 92 are aluminum oxide layers. In some embodiments, the liner layer 92 is optional and may be omitted.

Referring to FIG. 4(*r*), the remaining cavities in the memory structure 50 may be filled with a dielectric material 185, such as silicon dioxide ($SiO_2$). The dielectric layer 185 fills the cavities 180 between active layers and also fills the auxiliary trenches 84. A cap oxide layer 97 is then formed above the completed memory structure 50. In some embodiments, the cap oxide layer 97 may be a silicon oxide layer and may have a thickness of 100 nm to 200 nm. Vias and interconnects are formed in and above the cap oxide layer 97 to form interconnection between the storage transistors and the control circuitry, such as the CuA formed in the substrate 52. For example, the bit lines and local word lines of the memory stack are connected with control, select, and sense circuits that are formed in the CuA in the semiconductor substrate. In one example, global word lines, formed using copper metallization processes and materials, can be formed above the cap oxide layer 97 to connect the local word lines to the respective word line drivers formed in the CuA in the substrate 52.

In an alternate embodiment, the remaining cavities in the memory structure are not filled. Instead, the auxiliary trenches 84 are used to provide air gap isolation in the memory structure. Referring to FIG. 4(*s*), the memory structure 50*a* illustrates implementation of two levels of air gap isolation in some examples. First, after the liner layer 92 is formed, a dielectric layer 94 is deposited nonconformally into auxiliary trenches 84 which covers the sidewalls of the trenches 84 (i.e. covering the liner layer 92 on the trench sidewalls) while capping the ends of the inter-layer cavities 180 facing the auxiliary trenches 84. The dielectric layer 94 serves as a capping layer to create inter-layer air gap isolation regions between adjacent active layers 51 in each memory stack in the Z-direction. In some embodiments, the dielectric layer 94 is a non-conformally deposited dielectric layer, such as a silicon dioxide ($SiO_2$) layer or a silicon nitride ($Si_3N_4$) layer. The dielectric layer 94 implements the first level of air gap isolation by providing isolation in the vertical direction between storage transistors formed in an active stack.

Next, a dielectric layer 96 is formed at the top portions of the auxiliary trenches 84, such as by non-conformal deposition of a dielectric layer. In some examples, a dielectric layer, such as a silicon dioxide ($SiO_2$) layer, is deposited at the top portions of the auxiliary trenches 84 around the circumference of the trenches. The deposition process continues by growing the dielectric layer non-conformally until the dielectric layer merges in the middle of the trenches, thereby forming a capping layer capping the remaining cavities of trenches 84. The cap oxide layer 97 may be formed above the completed memory structure 50*a*. The dielectric layer 96 creates an air gap isolation between adjacent active stacks bordering the auxiliary trenches 84. The dielectric layer 96 implements the second level of air-gap isolation by providing isolation between adjacent memory stacks and reducing the parasitic capacitance therebetween. In particular, the first level of air gap isolation has the effect of minimizing the parasitic capacitive coupling between the first conductive layer (the bit line) in one memory plane and the second conductive layer (the source line) in an adjacent memory plane. The second level of air gap isolation has the effect of minimizing the parasitic capacitance between adjacent active stacks. In some embodiments, the dielectric layer 96 and the dielectric layer 94 are formed of the same dielectric material. In other embodiments, the dielectric layer 96 and the dielectric layer 94 can be formed of different dielectric materials. The dielectric layer 96 and cap oxide layer 97 together provide extra mechanical strength and stability to memory structure 50*a* by preventing listing or collapsing of long strings of tall and narrow memory stacks.

In further embodiments, a memory structure can be constructed to include either one of the two levels of air gap isolation. That is, the memory structure can form the first level of air gap isolation using the dielectric capping layer 94 and the remaining cavities in the auxiliary trenches 84 are filled with a dielectric material, such as silicon dioxide ($SiO_2$). Alternately, the memory structure can fill the inter-layer cavities 180 with a dielectric material, such as silicon dioxide ($SiO_2$) and the remaining cavities is capped by the dielectric capping layer 96 to form the second level of air gap isolation, without the first level of air gap isolation. The materials or types of isolation used for the inter-layer cavities and the auxiliary trench cavities can be selected based on the amount of desired parasitic isolation between the storage transistors within each active stack and between the active stacks.

FIG. 4(*t*) illustrates the memory structure 50*a* of FIG. 4(*s*) including the global word line connection. In the present example, a global word line metallization layer 194 is formed on the cap oxide layer 97 and connected to local word lines 68 formed in the memory structure 50*a* through vias 192 formed in the cap oxide layer. In some embodiments, the global word line metallization layer 194 is one of copper, tungsten, molybdenum, cobalt, or other metals, or compounds thereof. Vias 192 is filled with a metal layer, such as copper or other suitable metals. As thus configured, each global word line 194 is connected to a group of local word lines 68 to provide the control signal to the gate electrodes of the storage transistors formed in multiple memory planes associated with the respective vertical local word lines. More specifically, the global word lines 194 runs in the X-direction, perpendicular to the common bit lines 62 which runs in the Y-direction. Each global word line connects to the local word lines arranged in a row across the X-direction, as shown in FIG. 4(*t*). Meanwhile, the bit lines from different memory planes of each active stack are connected to bit line selectors through a staircase structure. The bit line selectors connect the bit lines to their respective sense amplifiers and voltage drivers circuit formed in the CuA, typically formed under the staircase structure.

In alternate embodiments, the memory structure may include additional dummy sublayers formed above the topmost multilayer 51. For example, in one alternate embodiment, the memory structure includes a topmost dummy inter-layer sacrificial layer which is removed during the channel separation process to provide access openings to the backside of the channel layer 66 and the channel layer 66 adjacent the dummy inter-layer sacrificial layer is separated so as to isolate any channel layer above from the memory strings formed below. In this manner, vias 192 can be formed to contact the local word lines (gate conductor layer 68) without concern for possible electrical shorts to the channel layer 66. Each global word line 194 connects to the local word lines through vias 192 to provide the control signal to the gate electrodes of the storage transistors formed in multiple memory planes associated with the respective vertical local word lines.

Figure 5A:
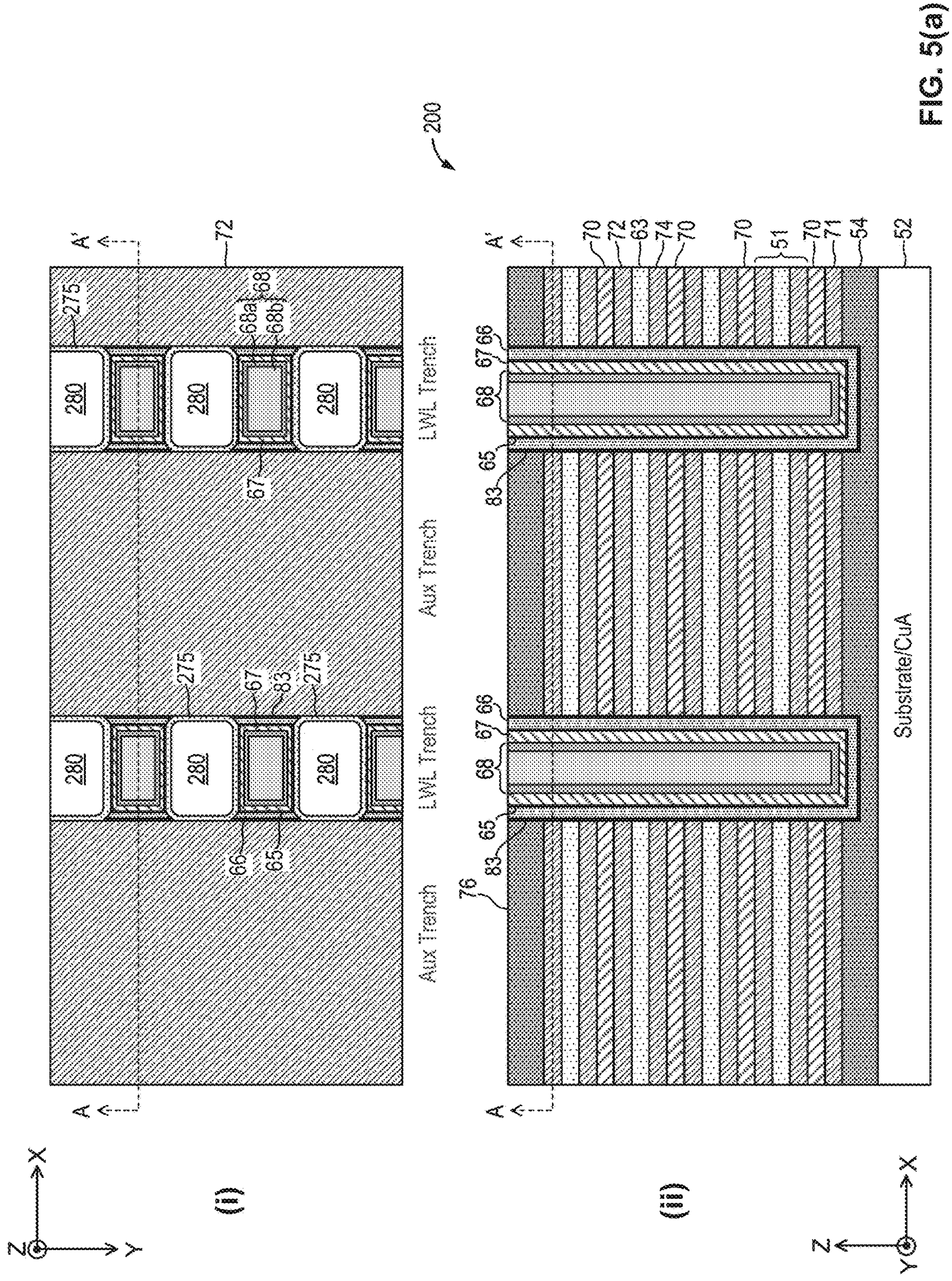
FIGS. 5(*a*) to 5(*c*) illustrate a process for fabricating a memory structure including HNOR memory strings in alternate embodiments of the present invention.
Figure 5B:
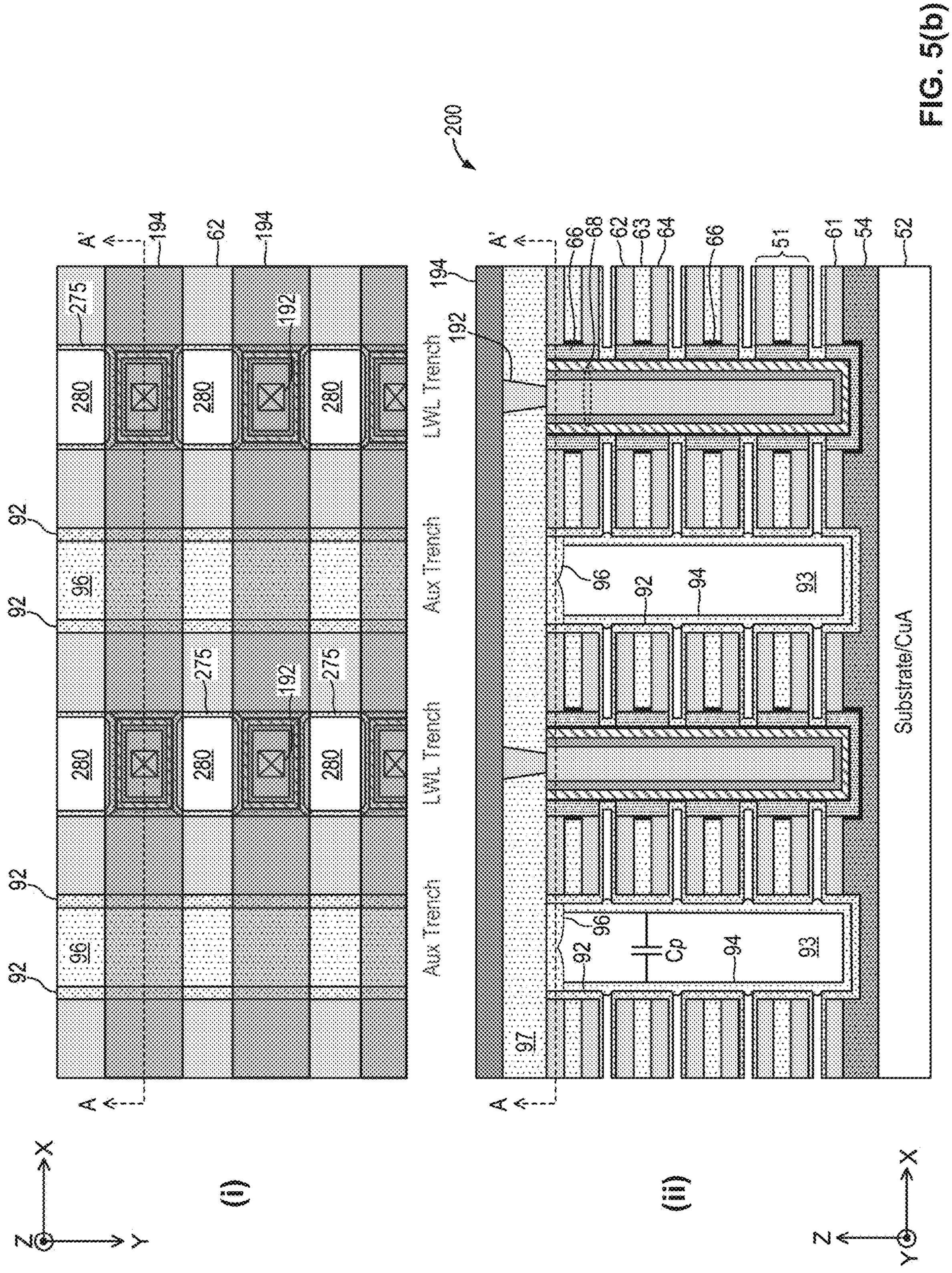
Figure 5C:
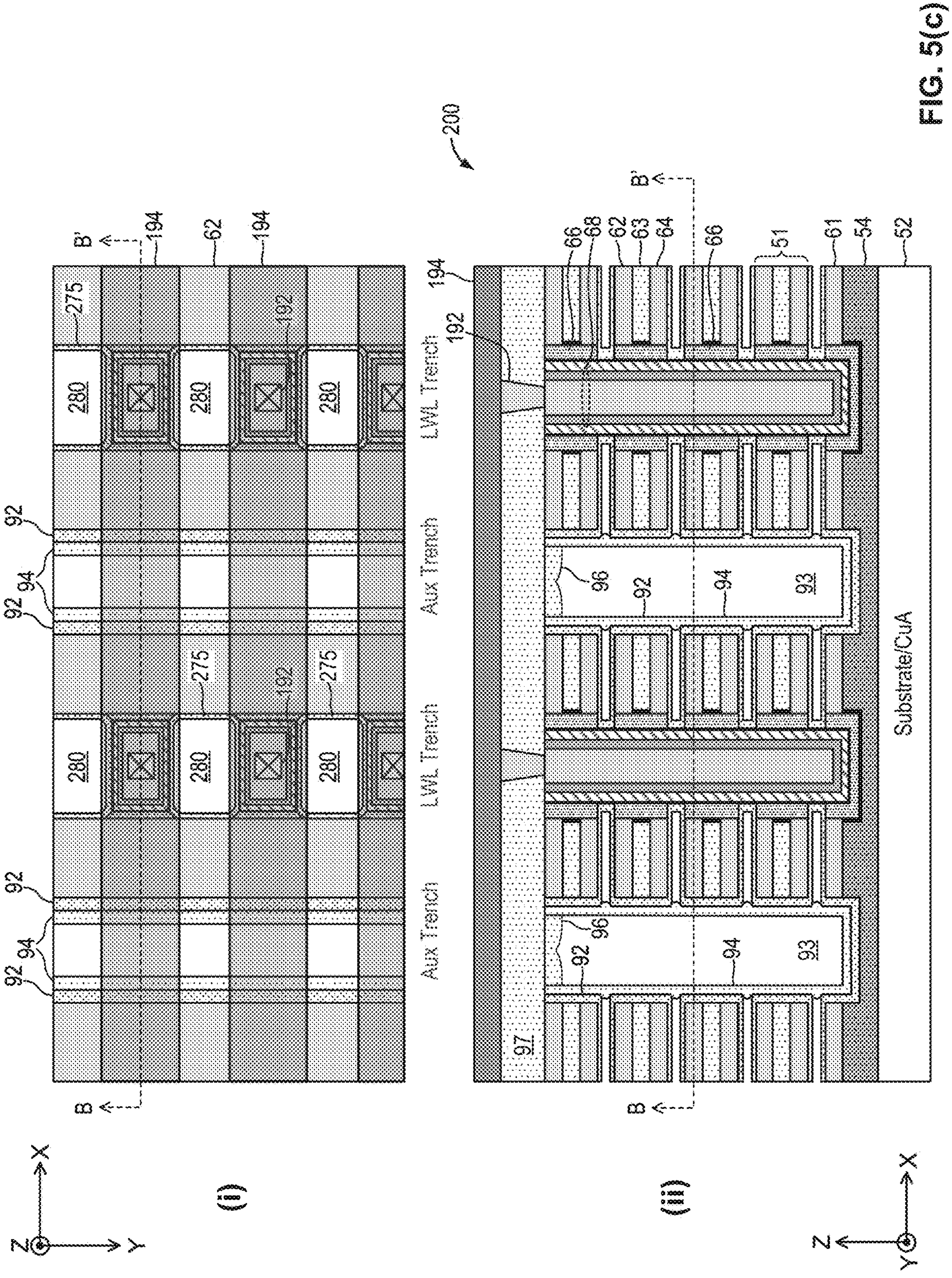

In the above-described embodiments, the LWL isolation area is filled with a dielectric layer. In alternate embodiments, the LWL isolation areas can be formed as air gap isolations. FIGS. 5(*a*) to 5(*c*) illustrate a process for fabricating a memory structure including HNOR memory strings in alternate embodiments of the present invention. Each figure in FIGS. 5(*a*) to 5(*c*) includes two views: view (i) is a horizontal cross-sectional view (i.e., in an X-Y plane) along line A-A' in view (ii), and view (ii) is a vertical cross-sectional view (i.e., in an X-Z plane) along line A-A' in view (i). FIGS. 5(*a*) to 5(*c*) illustrates part of the local word line formation process described with reference to FIG. 3.

Referring to FIG. 4(*i*), subsequent to forming the LWL structures, the sacrificial filler material and the liner layer are removed from the LWL isolation areas and the channel layer is separated, as described above. The local word line formation process 300 (FIG. 3) may then proceed to form an air gap liner in the LWL isolation areas with the remaining cavities forming air gap isolation (318*b*) (FIG. 3). Referring to FIG. 5(*a*), a dielectric liner layer 275 is formed on the sidewalls of the excavated cavities 89. In some embodiments, the dielectric liner layer 275, also referred to as an air gap liner, is a silicon nitride layer or an aluminum oxide ($Al_2O_3$) layer. The air gap liner 275 may be 1 nm-3 nm thick. The remaining cavities in the LWL isolation areas forming air gap isolation 280.

The fabrication proceeds as described above with reference to FIGS. 4(*k*) to 4(*t*) to form the auxiliary trenches, to perform metal replacement and channel separation. FIGS. 5(*b*) and 5(*c*) illustrate the resulting memory structure 200, in which two levels of air gap isolation and the global word line connection are formed. In memory structure 200, the LWL structures are isolated from each other in the Y direction by air gap isolation 280. View (i) in FIG. 5(*b*) illustrates the cross-sectional view from the top of the memory structure 200 (X-Y plane) at a line A-A' across the dielectric air gap capping layer 96. View (i) in FIG. 5(*c*) illustrates the cross-sectional view from the top of the memory structure 200 (X-Y plane) at a line B-B' across an active layer, in particular, across the conductive layer 62 of the active layer 51. FIG. 5(*c*) illustrates the air gap isolation being applied to isolate the local word line structures in the Y direction and also isolate the active stacks in the X direction.

In the above-described embodiments, with reference to FIGS. 4(*h*) and 4(*i*), after removal of the sacrificial filler material and the dielectric liner layers from the LWL isolation areas, the exposed channel layer on the sidewall of the local word line structures is removed to provide isolation of the channel layer on opposite sides of the local word line structures, in a process referred to as horizontal channel separation. In alternate embodiments of the present invention, the horizontal channel separation is performed in a two-step etch process. Referring to FIG. 4(*f*), the sacrificial filler material 82 is subjected to a first etch process. The first etch process is an isotropic etch process and remove the sacrificial filler material 82 from the center portions of the LWL isolation areas but leaving portions of the sacrificial filler material 82 at the corners of the LWL isolation areas. Accordingly, the dielectric liner layer 83 and the channel layer 66 is exposed in the excavated cavities only in the center portion of the LWL structures. Then using the excavated cavities 89, the exposed dielectric liner layer 83 is removed and the channel layer 66 is etched to remove the exposed portion of the channel layer. The channel layer materials at the corners of the cavities covered by the remaining sacrificial filler material will not be removed. After the whole or part of the central exposed portions of the channel layer is removed, the remaining sacrificial filler material at the corners is removed and the dielectric liner layers 81 and 83 are also removed In this manner, the horizontal channel separation can be realized while protecting the interface of the channel layer to the multilayer structure at which the storage transistors are to be formed.

In the above-described embodiments, various memory structures including multiple active layers (or memory planes) have been described. Each memory structure includes multiple memory stacks, each memory stack including multiple active layers, to realize a three-dimensional array of NOR memory strings. The memory structures can be used as the basic building block to form a high capacity, high density memory device including multiple three-dimensional arrays of the NOR memory strings. For example, the three-dimensional arrays of NOR memory strings may be arranged as a two-dimensional array of tiles, each tile including a three-dimensional array of NOR memory strings constructed using one of the memory structure described above and including staircase portions and other supporting circuitry, including connecting wiring through global word lines at the top or bottom of each of the tiles.

Figure 6:
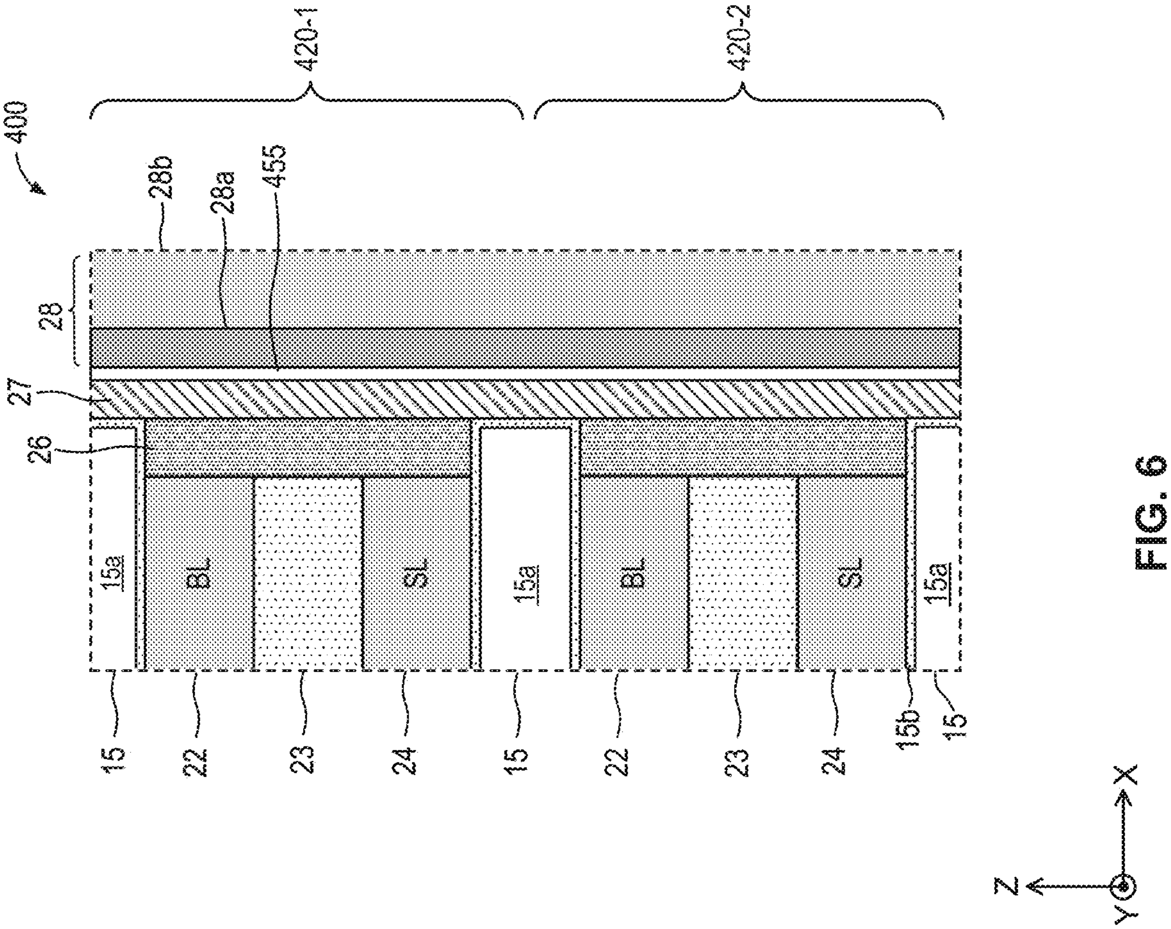
FIG. 6 illustrates the detail construction of a storage transistor formed in a memory structure in alternate embodiments of the present invention.

In the embodiments described above, such as with reference to FIG. 1(*a*), the ferroelectric storage transistors 20 formed in the memory structure 10 may include an interfacial layer 25 provided between the oxide semiconductor channel layer 26 and the ferroelectric polarization layer 27. The optional interfacial layer 25 is a thin dielectric layer and may be provided to function as a barrier layer or as an adhesion layer. In some embodiments, the memory structure of the present invention includes ferroelectric storage transistors that are formed including an interfacial dielectric layer formed between the ferroelectric dielectric layer and the gate conductor layer. FIG. 6 illustrates the detail construction of a storage transistor formed in a memory structure in alternate embodiments of the present invention. In particular, FIG. 6 illustrates a memory structure 400 including a pair of storage transistors 420-1 and 420-2 in two adjacent planes of a memory stack. Referring to FIG. 6, the storage transistor 420 includes a first conductive layer 22 forming the drain region (the common drain line or the common bit line) and a second conductive layer 24 forming the source region (the common source line), the conductive layers being spaced apart by the channel spacer dielectric layer 23. The storage transistor 420 further includes the channel layer 26, the gate dielectric layer 27 and the gate conductor layer 28 are formed on the sidewall of the memory stack. In the present embodiment, the channel layer 26 is an oxide semiconductor layer and is formed vertically along the sidewall of the memory stack and in contact with both the first conductive layer 22 and the second conductive layer 24 at each LWL structure. In some embodiments, the gate conductor layer 28 may include a conductive liner 28*a* as an adhesion layer (e.g. TiN) and a low resistivity conductor 28*b* (e.g. W). The storage transistor 420 is isolated from adjacent storage transistors in the memory stack by an inter-layer isolation layer 15. As thus configured, along each active strip (in the Y-direction), the storage transistors that share the common source line and the common bit line form a NOR memory string (referred herein as a "Horizontal NOR memory string" or "HNOR memory string").

To form the ferroelectric storage transistor, the storage transistor 420 includes a ferroelectric dielectric layer or ferroelectric polarization layer as the gate dielectric layer 27, also referred to as ferroelectric gate dielectric layer 27. For example, the ferroelectric gate dielectric layer 27 may be formed using a doped hafnium oxide material, such as zirconium-doped hafnium oxide (HfZrO or "HZO") layer. The ferroelectric polarization layer 27 serves as the storage layer of the storage transistor. In the present embodiment, the storage transistor 420 includes an interfacial dielectric layer 455 formed between the ferroelectric gate dielectric layer 27 and the gate conductive layer 28. For example, the interfacial dielectric layer 455 may be formed during the local word line formation process when the LWL structures are formed in excavated LWL shafts. After the deposition of the ferroelectric polarization layer 27, the interfacial dielectric layer 455 is deposited conformally onto the ferroelectric polarization layer 27 before the gate conductor layer 28 is deposited.

In some embodiments, the interfacial dielectric layer 455 is a thin layer and may be 0.5 nm to 3 nm thick. In some embodiments, the interfacial dielectric layer 455 is formed using a material with a high dielectric constant (K), that is, a high-K material with a dielectric constant greater than the dielectric constant of silicon dioxide ($SiO_2$). In some embodiments, the interfacial dielectric layer 455 may be a silicon nitride ($Si_3N_4$) layer, or a silicon oxynitride layer, or an aluminum oxide ($Al_2O_3$) layer. In one example, the interfacial dielectric layer 455 may have a thickness of 2 nm when the ferroelectric dielectric layer 27 has a thickness of 4-5 nm. The interfacial dielectric layer 455 serves as a barrier layer for the gate dielectric layer of the ferroelectric storage transistor 420. The interfacial dielectric layer 455 is optional and may be omitted in other embodiments of the present invention. In other embodiments, the interfacial dielectric layer 455, when included, may be formed as a multi-layer of different dielectric materials.

Precharge Transistors

In embodiments of the present invention, a memory structure includes three-dimensional array of NOR memory strings of junctionless ferroelectric storage transistors. The storage transistors in each NOR memory string share the common source line and the common drain line (common bit line). The voltage on each shared common source line can be separately applied directly from one or both ends of each source line in the three-dimensional structure. In some embodiments, the shared common source line is electrically floating and the source voltage is applied from the common bit line using precharge transistors so as to obviate the need to provide connector wires to the source lines at the staircase portions of the three-dimensional structure. In one embodiment, the source voltage on a given source line is set to a desired voltage value (such as the ground voltage) through a precharge operation using one or more precharge transistors formed along the memory string and the source line is then left floating after the precharge operation. In particular, the precharge operation set the common bit line to a desired voltage and then the precharge transistor is momentarily turned on to short the common bit line to the common source line to transfer the bit line voltage to the source line. As a result, the common source line is charged from the voltage on the common bit line to a voltage to equal to the bit line voltage. After the precharge operation is complete, the precharge transistor(s) is turned off. The common source line maintains a relatively constant voltage through the parasitic capacitance at the source terminals, such as the parasitic capacitance between the source terminals and the numerous local word line gate terminals of the storage transistors in the NOR memory string.

Figure 7:
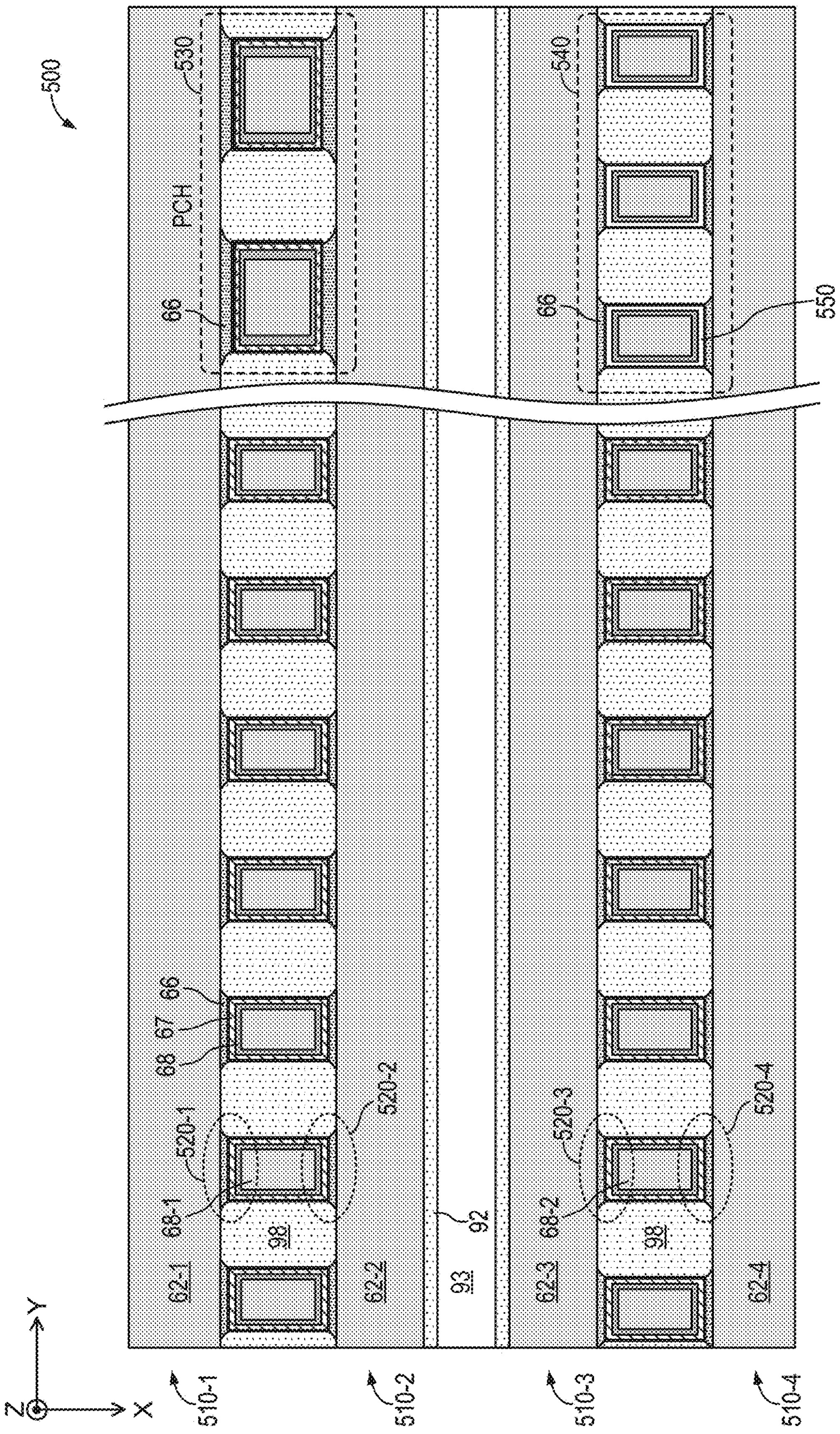
FIG. 7 is a cross-sectional view of a portion of a memory structure in the X-Y plane illustrating NOR memory strings with designated precharge transistors in embodiments of the present invention.

In embodiments of the present invention, various schemes can be used to provide precharge transistors in the three-dimensional array of NOR memory strings described above. FIG. 7 is a cross-sectional view of a portion of a memory structure in the X-Y plane illustrating NOR memory strings with precharge transistors in embodiments of the present invention. Like elements in FIG. 7 and FIG. 4(*t*) are given like reference numerals and will not be further described.

In a first embodiment, selected ferroelectric storage transistors in a NOR memory string are designated as precharge transistors. The precharge transistors are formed with different layer thicknesses and/or different transistor dimensions to optimize the electrical and endurance characteristics of the precharge transistors. Referring to FIG. 7, a memory structure 500 includes active stacks bordering operational trenches with local word lines formed therein and auxiliary trenches used for metal replacement and channel separation processes. In the present illustration, the cross-sectional view is taken at the first conductive layer 62 of a given active layer in an active stack. The first conductive layer 62 forms the common bit line of the memory string. A ferroelectric storage transistor 520 is formed at each intersection of the common bit line 62 with the channel layer 66, the ferroelectric polarization layer 67 and the gate conductor 68. FIG. 7 illustrates four exemplary memory strings 510-1 to 510-4 that are formed extending in the Y-direction along four active stacks (represented by respective first conductive layer 62-1 to 62-4). For example, each memory string 510 includes the ferroelectric storage transistors 520 formed along the active stack 62 and intersecting with all of the local word line structures along the active stack 62. The storage transistors 520 are isolated from other storage transistors in the memory string by the dielectric filled shafts 98.

It is instructive to note that in memory structure 200, a pair of memory strings 210 in each memory plane bordering a LWL trench have corresponding storage transistors sharing a local word line structure. Accordingly, each local word line activates two ferroelectric storage transistors in the memory strings bordering the LWL trench in each memory plane. In one example, in response to the local word line 68-1 being selected, ferroelectric storage transistors 520-1 and 520-2 associated with respective memory strings 510-1 and 510-2 are activated. The common bit lines 62-1 and 62-2 are in turn selected to provide access and the appropriate voltages are provided to the activated ferroelectric storage transistors 520-1 and 520-2. In another example, in response to the local word line 68-2 being selected, ferroelectric storage transistors 520-3 and 520-4 associated with respective memory strings 510-3 and 510-4 are activated. The common bit lines 62-3 and 62-4 are in turn selected to provide access and appropriate voltages are provided to the activated ferroelectric storage transistors 520-3 and 520-4. In some embodiments, inhibit voltages are applied to the activated but not selected ferroelectric storage transistors to protect the stored memory state at those ferroelectric storage transistors.

In a first embodiment, precharge transistors 530 are provided in each NOR memory string as ferroelectric storage transistors. In some embodiments, the precharge transistors are preferably with increased channel width. In other embodiments, the precharge transistors are provided with increased layer thicknesses. For example, the thickness of the oxide semiconductor channel layer may be increased for the precharge transistors. In other words, a precharge transistor 530 in a memory string 510 is constructed in the same manner the storage transistors 520 but is constructed with a width in the Y-direction greater than the width of the storage transistors 520. Alternately, the thickness of the channel layer 66 may be increased for the precharge transistors 530, as shown in FIG. 7. For example, the channel layer 66 of the precharge transistors may be 2-3 times the thickness of the channel layer 66 of the storage transistors 520. Several precharge transistors 530 may be provided in each memory string and dispersed throughout the respective memory string. Increasing the channel width or increasing the channel layer thickness of the ferroelectric storage transistor has the effect of increasing the On current (Ion) of the storage transistor. Accordingly, the precharge transistors 530 have a larger On current as compared to the storage transistors 520. The precharge transistor 530 thus have increased On current and increased drive for use during the precharge operation to effectively bias the common source line to the common bit line voltage.

In a second embodiment, non-memory transistors are formed in each memory string to use as precharge transistors. In some examples, FIG. 7 illustrates precharge transistors formed as non-memory transistors in the memory strings 510-3 and 510-4 in an exemplary embodiment. In the present embodiment, the precharge transistors 540 are junctionless transistors formed using the same semiconductor oxide channel layer 66 as the storage transistors but using a non-polarizable gate dielectric film 550 between the channel layer and the gate conductor 68. Several precharge transistors 540 may be provided in each memory string and dispersed throughout the respective memory string.

To form the precharge transistors 540 in the memory structure, a mask is applied to the memory structure to cover all of the memory strings with openings exposing locations where the precharge transistors 540 are to be formed. Note that the precharge transistors 540 may be formed during intermediate processing steps of the memory array. For example, the precharge transistors 540 may be formed in the memory structure 500 after the channel layer 66 is formed but before gate dielectric layer is formed.

Using the mask defining the precharge transistor openings, the channel layer 66 is deposited into the shaft openings. A gate dielectric layer 550 is then deposited on the sidewalls of the shafts on the channel layer 66. In one embodiment, the gate dielectric layer 550 is a silicon dioxide ($SiO_2$) layer. In other embodiments, the gate dielectric layer 550 can be a hafnium oxide layer ($HfO_2$), or a sandwich of silicon dioxide ($SiO_2$) capped by silicon oxynitride ($Si_2NO_3$), or aluminum oxide ($Al_2O_3$). Then, a conductive layer is deposited to serve as the gate conductor of the precharge transistors 540. The gate conductor may include successively deposited conductive liner layer and low resistivity conductor. In some embodiments, the conductive liner layer is a titanium nitride (TiN) layer and the conductor is a heavily doped polysilicon layer or a tungsten (W) layer. Excess deposited materials may be removed from the top of memory structure by CMP. The precharge transistors 540 thus formed are controlled by the conductor 68 as the control gate electrode. Subsequent to forming the precharge transistors 540, the fabrication process may cover the precharge transistors 540 and exposing the areas associated with the memory array to continue manufacturing the storage transistors. In some embodiments, the gate electrode of the precharge transistors 540 are connected to global word lines formed above the memory array which connect to the control circuits formed in the CuA to allow the control circuits or the memory controller coupled thereto to select and activate the precharge transistors 540 to perform precharge operations.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A process suitable for use in fabricating a memory structure comprising storage transistors configured in a NOR memory string above a planar surface of a semiconductor substrate, the process comprising:

above the planar surface, repeatedly depositing, alternately and one over another, a multilayer and an inter-layer sacrificial layer, each multilayer comprising first and second sacrificial layers and a first isolation layer between the first and second sacrificial layers;

forming a first plurality of trenches in the multilayers and the inter-layer sacrificial layers, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width;

forming a first liner layer on the sidewalls of the first plurality of trenches;

filling remaining volume of the first plurality of trenches with a sacrificial filler material;

forming a plurality of excavated shafts in the first plurality of trenches by removing the sacrificial filler material and the first liner layer from patterned shaft locations, the excavated shafts being spaced apart in the second direction in each trench, each excavated shaft being separated from an adjacent excavated shaft by an isolation area including the sacrificial filler material and the first liner layer; and forming a local word line structure in each of the plurality of excavated shafts, each local word line structure comprising: (i) an oxide semiconductor layer formed on the sidewalls of the excavated shaft; (ii) a ferroelectric dielectric layer formed on the oxide semiconductor layer; and (iii) a gate conductor layer formed on the ferroelectric dielectric layer.

2. The process of claim 1, further comprising:

subsequent to forming the local word line structures in the plurality of excavated shafts, removing the sacrificial filler material and the first liner layer in the isolation areas between the local word line structures; and using access through the excavated isolation areas, removing at least a portion of the oxide semiconductor layer formed on each sidewall of each excavated isolation area.

3. The process of claim 2, further comprising:

forming a first dielectric layer in the excavated isolation areas to form dielectric filled isolation areas between the local word line structures.

4. The process of claim 2, further comprising:

forming a second liner layer on the sidewalls of the excavated isolation areas, remaining cavities in the excavated isolation areas forming air gap isolation.

5. The process of claim 2, further comprising:

forming a second plurality of trenches in the multilayers and the inter-layer sacrificial layers, each trench in the second plurality of trenches having substantially the same depth, length and width as the first plurality of trenches, and wherein the first and second plurality of trenches divide the multilayers into a plurality of stacks of multilayer strips, each stack being separated from an adjacent stack by one of the trenches.

6. The process of claim 5, further comprising:

using access through the second plurality of trenches, removing the first and second sacrificial layers to form excavated cavities, the removing exposing the oxide semiconductor layer; and forming first and second conductive layers in the excavated cavities, the first and second conductive layers being in contact with the oxide semiconductor layer.

7. The process of claim 6, further comprising:

using access through the second plurality of trenches, removing the inter-layer sacrificial layer to form inter-layer excavated cavities; and using access through the second plurality of trenches and the inter-layer excavated cavities, removing the exposed portions of the oxide semiconductor layer.

8. The process of claim 7, further comprising:

forming a second dielectric layer in the memory structure, the second dielectric layer being formed in the inter-layer excavated cavities and cavities exposed by the second plurality of trenches.

9. The process of claim 8, further comprising:

before forming the second dielectric layer, forming a third liner layer on the exposed surface of the memory structure, including the inter-layer excavated cavities and cavities exposed by the second plurality of trenches.

10. The process of claim 7, further comprising:

forming a fourth liner layer on the exposed surface of the memory structure, including the inter-layer excavated cavities and cavities exposed by the second plurality of trenches; and forming a dielectric capping layer in a top portion of the second plurality of trenches to cap the trenches, the top portion being opposite the semiconductor substrate, the dielectric capping layer forming an air gap cavity in the second plurality of trenches under the dielectric caping layer and in the inter-layer excavated cavities.

11. The process of claim 1, wherein the first liner layer comprises a silicon dioxide layer and the sacrificial filler material comprises spin-on carbon or silicon germanium or silicon nitride.

12. The process of claim 11, wherein the sacrificial filler material comprises a spin-on carbon material with thermal stability at a processing temperature greater than 500° C.

13. The process of claim 11, wherein the sacrificial filler material comprises spin-on carbon and removing the sacrificial filler material comprises removing the spin-on carbon using a selective anisotropic etch process.

14. The process of claim 1, wherein filling remaining volume of the first plurality of trenches with the sacrificial filler material comprises:

depositing the sacrificial filler material into the first plurality of trenches;

etching back excess deposited sacrificial filler material from a top surface of the memory structure; and depositing a dielectric capping layer on the memory structure.

15. The process of claim 1, wherein forming the local word line structure in each of the plurality of excavated shafts comprises:

depositing the oxide semiconductor layer on the sidewalls of the excavated shafts;

depositing the ferroelectric dielectric layer in contact with the oxide semiconductor layer on the sidewalls of the excavated shafts; and depositing the gate conductor layer in remaining cavities of the excavated shafts, the gate conductor layer being surrounded by the ferroelectric dielectric layer in each local word line structure.

16. The process of claim 15, further comprising:

subsequent to depositing the oxide semiconductor layer and before depositing the ferroelectric dielectric layer, forming an interfacial dielectric layer on the oxide semiconductor layer.

17. The process of claim 16, wherein forming the interfacial dielectric layer comprises forming a silicon nitride layer or an aluminum oxide layer or a layer of high dielectric constant material as the interfacial dielectric layer.

18. The process of claim 15, further comprising:

subsequent to depositing the ferroelectric dielectric layer and before depositing the gate conductor layer, forming a second interfacial dielectric layer on the ferroelectric dielectric layer.

19. The process of claim 18, wherein forming the second interfacial dielectric layer comprises forming a silicon nitride layer or an aluminum oxide layer or a layer of high dielectric constant material as the second interfacial dielectric layer.

20. The process of claim 1, wherein the gate conductor layer comprises a titanium nitride layer.

21. The process of claim 1, wherein the ferroelectric dielectric layer comprises a doped hafnium oxide layer.

22. The process of claim 21, wherein the ferroelectric dielectric layer has a thickness of 2-8 nm in the third direction.

23. The process of claim 1, wherein the oxide semiconductor layer comprises one of an indium gallium zinc oxide (IGZO) layer, an indium zinc oxide (IZO) layer, an indium tungsten oxide (IWO) layer, or an indium tin oxide (ITO) layer.

24. The process of claim 23, wherein the oxide semiconductor layer has a thickness of 1.5 to 12 nm in the third direction.

25. The process of claim 1, further comprising:

subsequent to forming the local word line structures in the plurality of excavated shafts, removing the sacrificial filler material in center portions of the isolation areas between the local word line structures, the sacrificial filler material remaining at corners of the isolation areas;

using access through the excavated isolation areas, removing exposed portions of the oxide semiconductor layer formed on the sidewalls of the excavated isolation areas; and removing remaining sacrificial filler material and the first liner layer, wherein the channel layer covered by the remaining sacrificial filler material and the first liner layer remains.

* * * * *